(12) United States Patent
Wang et al.

(10) Patent No.: US 8,194,492 B2
(45) Date of Patent: *Jun. 5, 2012

(54) VARIABLE RESISTANCE MEMORY DEVICE AND SYSTEM

(75) Inventors: Qi Wang, Suwon-si (KR); Kwang-Jin Lee, Hwaseong-si (KR); Woo-Yeong Cho, Suwon-si (KR); Taek-Sung Kim, Yongin-si (KR); Kwang-Ho Kim, Hwaseong-si (KR); Hyun-Ho Choi, Suwon-si (KR); Yong-Jun Lee, Anyang-si (KR); Hye-Jin Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 273 days.

This patent is subject to a terminal disclaimer.

(21) Appl. No.: 12/693,005

(22) Filed: Jan. 25, 2010

(65) Prior Publication Data

US 2010/0124105 A1    May 20, 2010

Related U.S. Application Data

(63) Continuation-in-part of application No. 12/417,679, filed on Apr. 3, 2009, now Pat. No. 7,952,956.

(30) Foreign Application Priority Data

Apr. 8, 2008    (KR) .................. 10-2008-0032768

(51) Int. Cl.
*G11C 8/00*    (2006.01)

(52) U.S. Cl. .................. 365/230.03; 365/163

(58) Field of Classification Search ............. 365/230.03, 365/163, 148
See application file for complete search history.

(56) References Cited

U.S. PATENT DOCUMENTS

| | | | | |
|---|---|---|---|---|
| 6,594,169 B2* | 7/2003 | Sakui | ............................ | 365/51 |
| 6,807,106 B2* | 10/2004 | Gonzales et al. | ........ | 365/185.33 |
| 7,193,923 B2* | 3/2007 | Nishihara et al. | ........ | 365/230.03 |
| 7,864,557 B2* | 1/2011 | Reggiori et al. | ................ | 365/94 |
| 7,952,956 B2* | 5/2011 | Wang et al. | .............. | 365/230.09 |
| 2007/0115730 A1* | 5/2007 | Randolph et al. | ........ | 365/185.29 |
| 2008/0168304 A1 | 7/2008 | Flynn et al. | | |
| 2008/0256183 A1 | 10/2008 | Flynn et al. | | |
| 2008/0256292 A1 | 10/2008 | Flynn et al. | | |
| 2009/0034333 A1* | 2/2009 | Garnier | .................... | 365/185.11 |
| 2009/0168494 A1 | 7/2009 | Lee et al. | | |
| 2009/0207665 A1* | 8/2009 | Louie et al. | .............. | 365/185.22 |

FOREIGN PATENT DOCUMENTS

| | | |
|---|---|---|
| JP | 2005190201 A | 7/2005 |
| KR | 1019990029329 A | 4/1999 |
| KR | 1020000067748 A | 11/2000 |
| KR | 1020030009118 A | 1/2003 |
| KR | 1020030021631 A | 3/2003 |
| KR | 1020050107369 A | 11/2005 |
| KR | 100610647 B1 | 8/2006 |

* cited by examiner

*Primary Examiner* — Vu Le
(74) *Attorney, Agent, or Firm* — Volentine & Whitt, PLLC

(57) ABSTRACT

Disclosed is a semiconductor memory device including a memory cell array having a plurality of variable resistance memory cells divided into first and second areas. An I/O circuit is configured to access the memory cell array under the control of control logic so as to access the first or second area in response to an external command. The I/O circuit accesses the first area using a memory cell unit and the second area using a page unit.

13 Claims, 39 Drawing Sheets

| No. | United Interface | NOR Interface | NAND Interface |
|---|---|---|---|
| 1 | A[MSB] | A[MSB:16] | CLE |
|   | A[MSB-1:16] |   | – |
| 2 | DQ[7:0] | DQ[15:0] | IO[7:0] |
|   | DQ[15:8] |   | – |
| 3 | nCE | nCE_NOR | nCE_NAND |
| 4 | SEL |   |   |
| 5 | nOE | nOE | nRE |
| 6 | nRESET | nRESET | – |
| 7 | VPP | VPP | – |
| 8 | nWE | nWE | nWE |
| 9 | nWP | nWP | nWP |
| 10 | CLK | CLK | – |
| 11 | RDY | RDY | RnB |
| 12 | nAVD | nAVD | ALE |

Fig. 25

| Page buffer Scheme / Write buffer Scheme | SEL_NAND='0' | | SEL_NAND='1' |
|---|---|---|---|
| CMD_Write_Buf='0' | Random Write (Program) | Random Read | Page Read |
| CMD_Write_Buf='1' | Buffer Write (Program) | | Page Write (Program) |

Fig. 36

| | PRAM | | Flash Memory |
|---|---|---|---|
| | Background data 0 | Background data 1 | |
| MRS | High | Low | * |
| Fuse | Cutting | Not Cutting | * |
| Flexible Program | Erase; 0 (all cells) Write; 1 (selected) | Erase; 1 (all cells) Write; 0 (selected) | Erase; 1 (all cells) Write; 0 (selected) |
| Write Speed | x5 | x1 | * |

VARIABLE RESISTANCE MEMORY DEVICE AND SYSTEM

PRIORITY STATEMENT

This application is a continuation-in-part application of U.S. application Ser. No. 12/417,679 filed Apr. 3, 2009, which claims priority under 35 U.S.C. §119 to Korean Patent Application No. 2008-0032768 filed on Apr. 8, 2008, the collective subject matter of which is hereby incorporated by reference.

BACKGROUND

The present inventive concept relates to a semiconductor memory device and memory system. More particularly, the present inventive concept relates to a variable resistance memory device and memory system incorporating same.

Demand is increasing for a semiconductor memory device capable of randomly accessing non-volatile stored data and being highly integrated to yield large data storage capacity. A typical example of such a semiconductor memory device is flash memory commonly used in portable electronic devices, for example. As an alternative to flash memory, certain variable resistance memory devices providing non-volatile data storage have been proposed as replacements for volatile memory devices such as the conventional DRAM.

Exemplary variable resistance memory devices include the Ferroelectric RAM (FRAM) utilizing a ferroelectric capacitor, Magnetic RAM (MRAM) using tunneling magneto-resistive (TMR) layer, and phase change memory device using chalcogenide alloys. Of these, the phase change memory device enjoys relative advantages in its relatively simple fabrication process, large data storage capacity, and relatively low cost of fabrication.

FIGS. 1 and 2 schematically illustrate memory cells for variable resistance memory devices. Referring to FIG. 1, a memory cell 10 includes a memory element 11 and a select element 12. The memory element 11 is connected between a bit line BL and the select element 12, and the select element 12 is connected between the memory element 11 and a ground.

The memory element 11 includes a variable resistance material (e.g., an alloy of Ge—Sb—Te or "GST"). Such variable resistance materials exhibiting a resistance that varies in relation to an applied temperature. The variable resistance material is characterized by two stable states (a crystalline state and an amorphous state), each induced by a particular temperature application. The state of the variable resistance material may be varied according to a current supplied via the bit line BL. The variable resistance memory device programs data using the state-disparate resistance characteristics of the variable resistance material.

The select element 12 includes an NMOS transistor NT. A word line WL is connected to a gate of the NMOS transistor NT. When a predetermined voltage is supplied to the word line WL, the NMOS transistor NT is turned ON. When the NMOS transistor NT is turned ON, a current is supplied to the memory element 11 via the bit line BL. Referring to FIG. 1, the memory device 11 is connected between the bit line BL and the select element 12. However, the select element 12 may be connected between the bit line BL and the memory element 11.

Referring to FIG. 2, a memory cell 20 includes a memory element 21 and a select element 22. The memory element 21 is connected between the bit line BL and the select element 22, and the select element 22 is connected between the memory element 21 and ground. The memory element 21 is configured identically with the memory element 11 of FIG. 1.

The select element 22 is a diode D. The memory element 21 is connected to an anode of the diode D, and a word line WL is connected to a cathode thereof. When a voltage difference between the anode and cathode of the diode D becomes higher than a threshold voltage, the diode D is turned ON. When the diode D is turned ON, a current is supplied to the memory element 21 via the bit line BL.

FIG. 3 is a graph generally illustrating the respective temperature/time characteristics (or temperature conditions) for programming (i.e., changing the state) of the variable resistance material of FIGS. 1 and 2. In FIG. 3, a reference numeral 1 indicates a first temperature condition placing the variable resistance material into the amorphous state. Reference numeral 2 indicates a second temperature condition placing the variable resistance material into the crystalline state.

In the first temperature condition, the variable resistance material is heated by a temperature higher than its melting temperature (Tm) for a first time period (T1), then quickly quenched into the amorphous state. Conventionally, the amorphous state is assigned a reset data state, or a data value of '1'. The variable resistance memory device provides a so-called "reset current" to the variable resistance material in order to program it to the reset state.

In the second temperature condition, the variable resistance material is heated by a temperature higher than its crystallization temperature (Tc) but lower than the melting temperature (Tm) for a second time period (T2) longer than T1. Then the variable resistance material is cooled relatively slowly into the crystalline state. The crystalline state is conventionally assigned a set state, or a data value of '0'. The variable resistance memory device provides a so-called "set current" to the variable resistance material in order to program it to the set state.

Moving from the foregoing discussion of variable resistance memory devices, a NOR flash memory may generally be used to store frequently updated data, such as meta data. NOR flash memory thus supports random data using a relatively small unit (e.g., 16 bits) to enable rapid data access. Moreover, NOR flash memory is capable of accessing data without address mapping by means of a flash translation layer (FTL).

On the other hand, NAND flash memory may be used to effectively store large quantities of less frequently updated data, such as so-called user data. In order to access data stored in NAND flash memory, a FTL is required to map addresses. The FTL converts a physical address to a logical address, or vice versa. NAND flash memory performs access operations in page units and does not support random data access. Therefore, NAND flash memory is not suitable for use in accessing data in small unit sizes, but is advantageous in accessing large blocks of data. Due to such characteristics, NOR flash memory and NAND flash memory are used for different purposes, and NOR flash memory and NAND flash memory are typically both required to effectively store code data (or meta data) and user data.

FIG. 4 is a block diagram of a general computer system including both NOR flash memory and NAND flash memory. Referring to FIG. 4, a NOR flash memory 110 is connected to a system bus 150 via a NOR controller 120. A NAND flash memory 130 is connected to the system bus 150 via a NAND controller. As such, both the NOR controller 120 and the NAND controller 140 are required in a system having both the NOR flash memory 110 and NAND flash memory 120. This requirement increases the overall manufacturing cost for the semiconductor memory device, and adversely affects integration density of the device.

SUMMARY

In one embodiment, the present inventive concept provides a variable resistance memory device comprising; a memory cell array including a plurality of variable resistance memory cells divided into a first area and a second area, an input/output circuit configured to access the memory cell array, and a control logic configured to control the input/output circuit to access the first area or the second area in response to an external command, wherein the input/output circuit supplies read current to at least one memory cell during a read operation, and the first area has higher response speed and shorter data access time than the second area.

In another embodiment, the inventive concept provides a memory system comprising; a variable resistance memory device including a variable resistance memory cell array divided into a first area and a second area, and a memory controller configured to access the first area or the second area in response to an external command, wherein the memory controller erases the second area as a first logic state, and programs selected memory cells of the second area as a second logic state.

In another embodiment, the inventive concept provides a storage class memory system comprising; a processor, a storage class memory including a variable resistance memory cell array divided into a first area and a second area, and a memory controller configured to access the first area or the second area of the variable resistance memory cell array in response to a command from the processor.

BRIEF DESCRIPTION OF THE DRAWINGS

The accompanying drawings are included to provide a further understanding of the inventive concept, and are incorporated in and constitute a part of this specification. The drawings illustrate example embodiments of the present inventive concept and, together with the description, serve to explain principles of the present inventive concept. In the drawings:

FIG. 25 is a table illustrating an operation mode of the memory system shown in FIG. 24.

FIG. 36 is a table listing operation characteristics for the variable resistance memory device shown in FIG. 32.

DESCRIPTION OF EMBODIMENTS

The present inventive concept will now be described in some additional detail with reference to the accompanying drawings. This inventive concept may, however, be embodied in many different forms and should not be construed as being limited to only the illustrated embodiments. Rather, these embodiments are presented as teaching examples. Throughout the written description and drawings, like reference numbers and indicators refer to like or similar elements.

Figure 5:
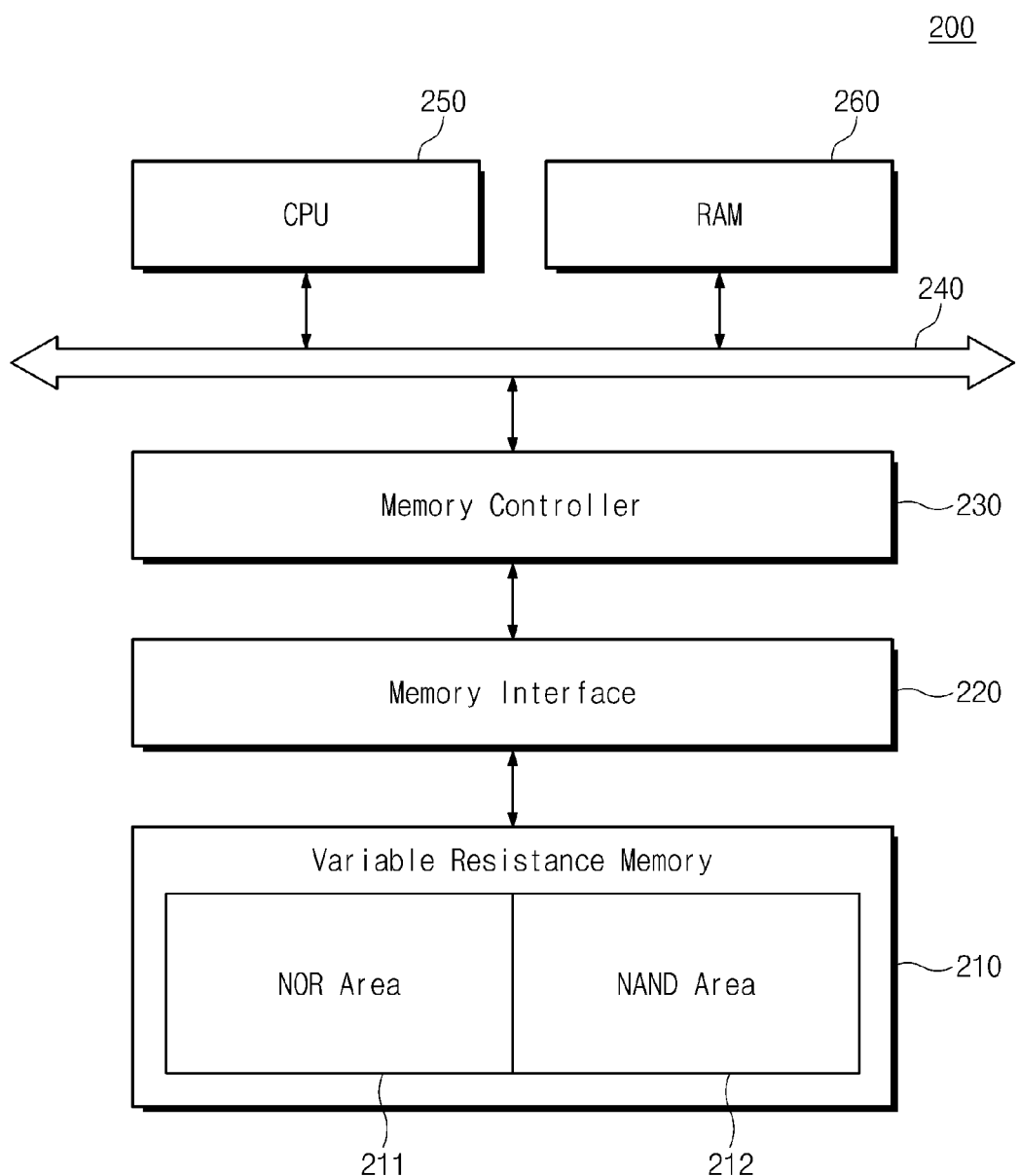
FIG. 5 is a schematic block diagram of a computer system including a memory system according to an embodiment of the inventive concept.

FIG. 5 is a schematic block diagram illustrating a computer system including a memory system according to an embodiment of the inventive concept. Referring to FIG. 5, a computer system 200 includes a semiconductor memory device comprising a variable resistance memory device 210, a memory interface 220, a memory controller 230, a system bus 240, a Central Processing Unit (CPU) 250, and a random access memory device 260. The random access memory device 260 may function as a main memory.

The variable resistance memory device 210, the memory interface 220, and the memory controller 230 may be realized in separate semiconductor integrated circuits or in a single semiconductor integrated circuit.

Although not shown, a conventional application chipset, a camera image processor (CIS), and/or a mobile DRAM may be further provided in relation to the illustrated computer system. Integration of these various additional components is deemed well within ordinary skill in the art.

The variable resistance memory device 210 includes a NOR area 211 and a NAND area 212. The NOR area 211 operates in a manner similar to a conventional NOR flash memory, as understood by those skilled in the art. In other words, data stored in the NOR area 211 may be accessed randomly in a defined memory cell unit. Thus, relatively small quantity data requiring rapid input and output, (e.g., code data or meta data) may be conventionally stored and accessed from the NOR area 211.

The NAND area 212 operates in a manner similar to a conventional NAND flash memory. In other words, the data stored in the NAND area 212 may be accessed in a defined page unit. The page may consist of a plurality of memory cells. Bulk data less frequently changed, (e.g., user data) may be stored in the NAND area 212.

A ratio of the NOR area 211 to the NAND area 212 in the variable resistance memory device 210 may be varied by means of mode register setting (MRS) or fuse selection and setting. For example, the mode register setting (MRS) may be conducted so that all a memory cell array of the variable resistance memory device 210 may be designated as the NOR area 211. Alternatively, the mode register setting MRS may be conducted so that a half of the memory cell array of the variable resistance memory device 210 may be designated as the NOR area 211, and the other half of the memory cell array may be designated as the NAND area 212.

The memory controller 230 controls the memory interface 220 in response to an external command transferred via the system bus 240. The memory interface 220 supplies control signals to the variable resistance memory device 210 in response to a control of the memory controller 230. For example, the memory interface 220 supplies a NOR area signal to the variable resistance memory device 210 to access code data or meta data. Or, the memory interface 220 supplies a NAND area signal to access user data.

As such, the NOR area 211 and NAND area 212 are constituted in one variable resistance memory device 210 according to the computer system 200 of the present inventive concept. The NOR area 211 and NAND area 212 are controlled by a single memory controller 230.

Figure 6:
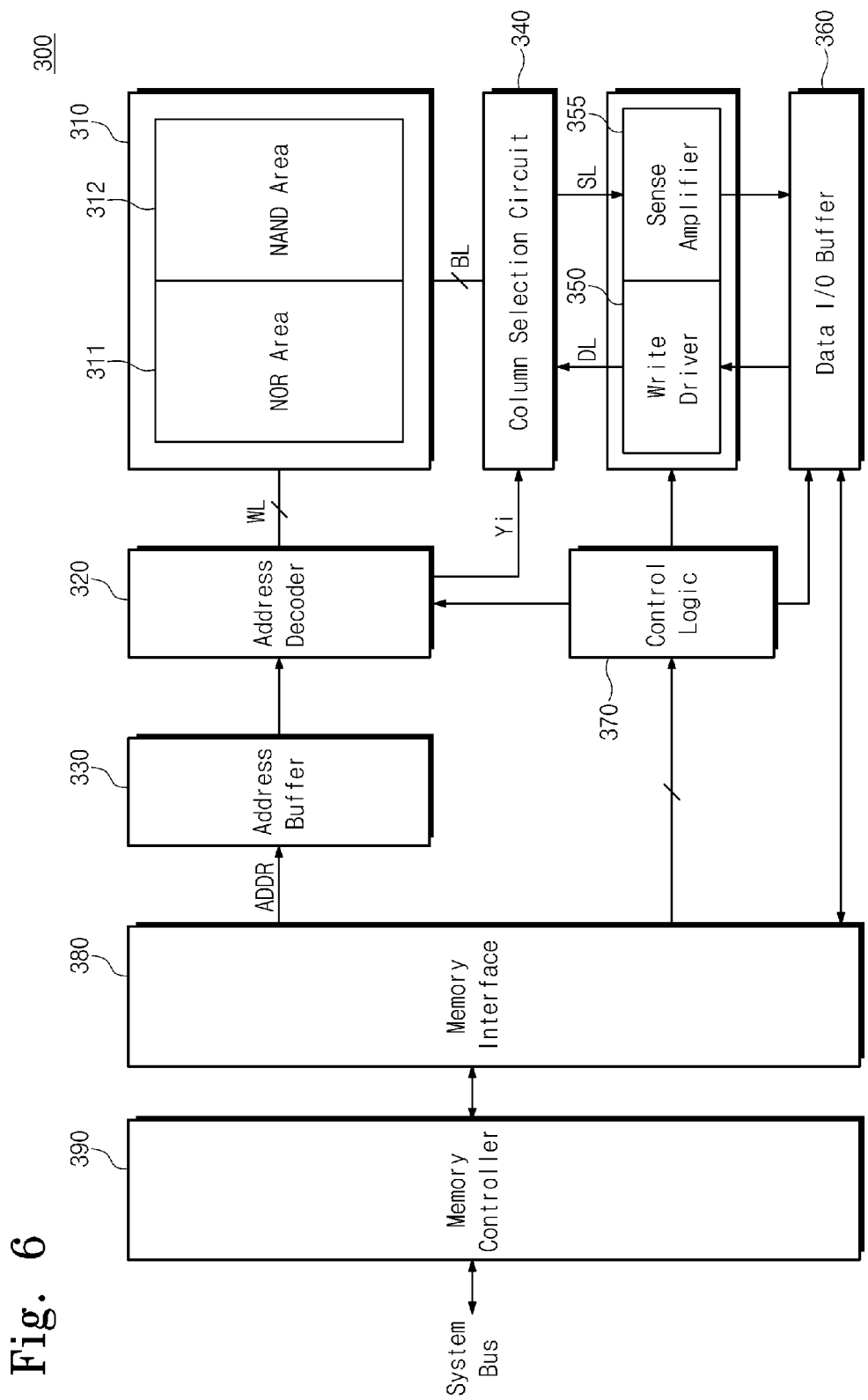
FIG. 6 is a block diagram illustrating a memory system according to an embodiment of the inventive concept.

FIG. 6 is a block diagram illustrating an embodiment of a memory system according to the present inventive concept. Referring to FIG. 6, the memory system 300 includes a variable resistance memory device, a memory interface 380, and a memory controller 390. The variable resistance memory device includes a memory cell array 310, an address decoder 320, an address buffer 330, a column selection circuit 340, a write driver 350, a sense amplifier 355, a data input/output buffer 360, and control logic 370.

The memory cell array 310 consists of a plurality of memory cells. For example, each of the memory cells may comprise a conventional memory element and a select element, such as the ones illustrated in FIGS. 1 and 2. In one embodiment of the inventive concept, the memory element includes a variable resistance material, such as GST, and the select element includes a transistor NT or a diode D. A resistance value of the memory cell is varied according to the program state of the variable resistance material. Possible program states may include a crystalline state having a low resistance and an amorphous state having a high resistance. The crystalline state is assigned a data value of "0" which is called the set state. The amorphous state is assigned a data value of "1" which is called the reset state. On the other hand, the memory cell may be configured to have a plurality of intermediate states which are states between the crystalline state and the amorphous state. Such a multi-level cell MLC may store more than 2-bit data in one memory cell.

The address decoder 320 is connected to the memory cell array 310 by means of word lines WL. The address decoder 320 decodes an external address ADDR, and supplies a bias voltage to a selected word line WL. Also, the address decoder 320 generates a column select signal Yi for selecting bit lines BL. The column select signal Yi is provided to the column selection circuit 340. The address buffer 330 provides the address ADDR received from an external source to the address decoder 320.

The column selection circuit 340 is connected to the memory cell array 310 by means of the bit lines BL. The column selection circuit 340 selects bit lines BL in response to the column selection signal Yi provided from the address decoder 320. The column selection circuit 340 connects the selected bit lines BL and corresponding data lines DL in response to the column selection signal Yi during a write operation, and connects the selected bit line BL and corresponding sense lines SL in response to the column selection signal Yi during a read operation.

The write driver 350 receives pulse control signals, and provides a program current to the data lines DL. The pulse control signals are supplied from the control logic 370. The program current includes a set current for programming data "0" to a memory cell, and a reset current for programming data "1" to a memory cell. Also, the write driver 350 supplies the program current once or more according to a multi-state of the memory cell, during a multi-level cell (MLC) program operation.

The sense amplifier 355 senses a difference between a voltage of a sense line SL and a reference voltage, to read data stored in the selected memory cell. Here, the reference voltage is supplied from a reference voltage generating circuit (not shown). The sense amplifier 355 operates in response to a control signal supplied from the control logic 370.

The data input/output buffer 360 outputs or receives data to and from the memory interface 380, in response to a data input/output control signal. The data input/output control signal is supplied from the control logic 370.

The memory controller 390 controls the memory interface 380 in response to an external command. The memory interface 380 controls the control logic 370 in response to the signals supplied from the memory controller 390. The control logic 370 controls write, read, and erase operations of the variable resistance memory device.

For example, in case a read command is input by means of the system bus, the memory controller 390 detects a storage location of data, with reference to area information. The area information is stored in the memory controller 390. The area information indicates whether the memory cell array is designated to the NOR area 311 or the NAND area 312. The area information may be varied by means of mode register setting or fuse setting. For example, the mode register setting (MRS) value may be varied so that all of the memory cell array 310 may be used as the NOR area 311. The area information may be generated whenever the memory system 300 is booted. Alternatively, the area information may be stored in a nonvolatile memory in the memory system 300 and loaded on booting.

In case (e.g.) code data or meta data is stored in the NOR area 311, the memory controller 390 controls the memory interface 380 so that the NOR area 311 of the variable resistance memory device may be accessed. Here, the memory interface 380 supplies NOR area access signals to the control logic 370. Or, in case (e.g.) user data is stored in the NAND area 312, the memory controller 390 controls the memory interface 380 so as to access the NAND area 312 of the variable resistance memory device. Here, the memory interface 380 supplies NAND area access signals to the control logic 370. The control logic 370 accesses the NOR area 311 or the NAND area 312 in response to the NOR area access signals or the NAND area access signal supplied from the memory interface 380.

According to the above described configuration, the memory system 300 illustrated in FIG. 6 may selectively access the NOR area 311 or the NAND area 312. One possible method for accessing the NOR area 311 and the NAND area 312 within memory system 300 will be described below in some additional detail.

Figure 7:
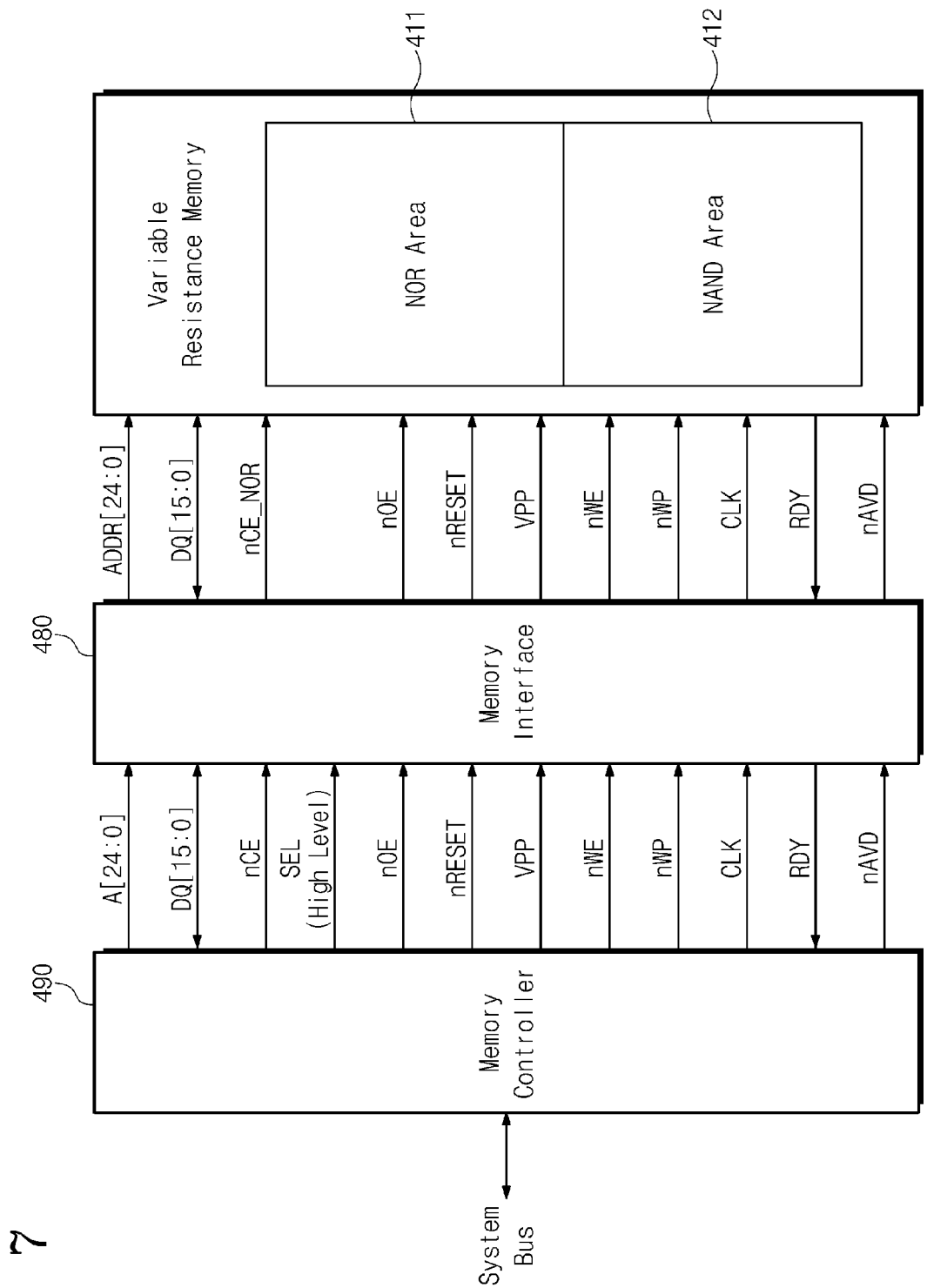
FIG. 7 is a block diagram illustrating exemplary control/address/data signals for the memory system of FIG. 6.

FIG. 7 is a block diagram illustrating various control/address/data signals for the exemplary memory system illustrated in FIG. 6. Such signaling is useful when the NOR area of the variable resistance memory device is accessed. Referring to FIG. 7, the memory controller 490 supplies a plurality of signals to the memory interface 480 in response to an external command input via a system bus. In detail, the memory controller 490 supplies a plurality of signals to the memory interface 480 by means of address pins A[24:0], data pins DQ[15:0], a chip enable signal pin nCE, a select signal pin SEL, an output enable signal pin nOE, a reset signal pin nRESET, a write enable signal pin nWE, a write protection pin nWP, a clock signal pin CLK, and an address valid input signal pin nAVD. Particularly, the memory controller 490 supplies a select signal SEL of a high level to the memory interface 480 in order to access a NOR area 411 of a variable resistance memory device.

The memory interface 480 supplies a plurality of signals to the variable resistance memory device in response to the select signal SEL of a high level. The plurality of signals are signals for accessing the NOR area 411. Particularly, the memory interface 480 supplies an activated NOR chip enable signal nCE_NOR to the variable resistance memory device.

In other words, the memory controller 490 supplies a plurality of signals to the memory interface 480 in response to an external command. The memory interface 480 converts the plurality of signals into NOR area access signals in response to the select signal SEL of a high level, and supplies the converted NOR area access signals to the variable resistance memory device.

Figure 8:
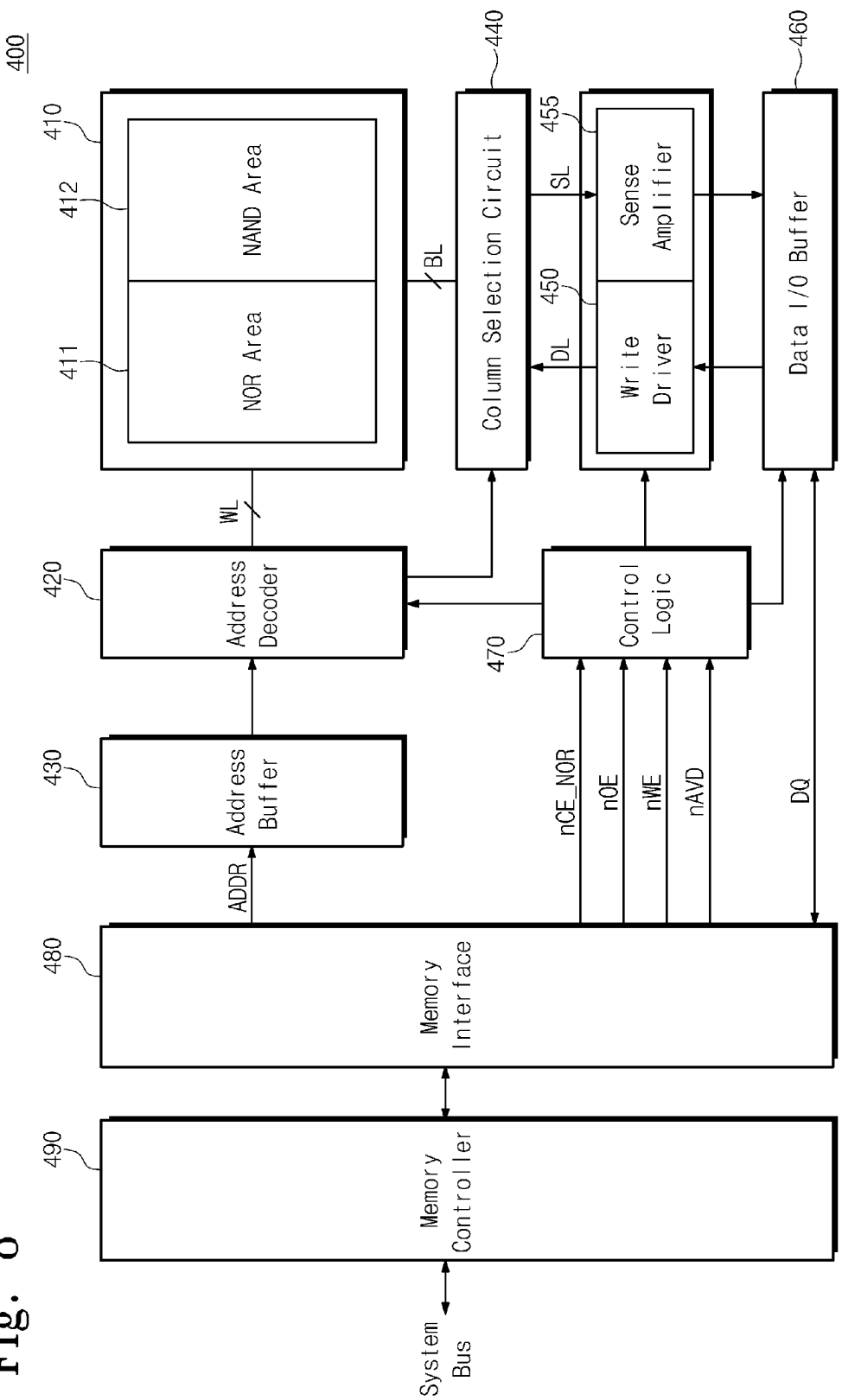
FIG. 8 is a block diagram illustrating one possible method operable within the memory system of FIG. 6.

FIG. 8 is a block diagram illustrating one possible method operable within the memory system of FIG. 6 for accessing the NOR area of a variable resistance memory device. Referring to FIG. 8, a memory controller 490 supplies a plurality of signals to a memory interface 480 in response to an external command. Particularly, the memory controller 490 supplies a select signal SEL of a high level to the memory interface 480 in order to access a NOR area 411 of the variable resistance memory device.

The memory interface 480 supplies a plurality of signals to the variable resistance memory device in response to the select signal SEL of a high level. In detail, the memory interface 480 supplies an address ADDR to the address buffer 430. And, the memory interface 480 supplies a NOR chip enable signal nCE_NOR, an output enable signal nOE, a write enable signal nWE, and an address valid input signal nAVD to the control logic 470. In particular, the memory interface 480 supplies an activated NOR chip enable signal nCE_NOR to the control logic 470.

The control logic 470 controls peripheral circuits (including an address decoder 420, a write driver 450, a sense amplifier 455, and a data input/output buffer 460) so as to access the NOR area 411 of the memory cell array in response to the activated NOR chip enable signal nCE_NOR.

Figure 9:
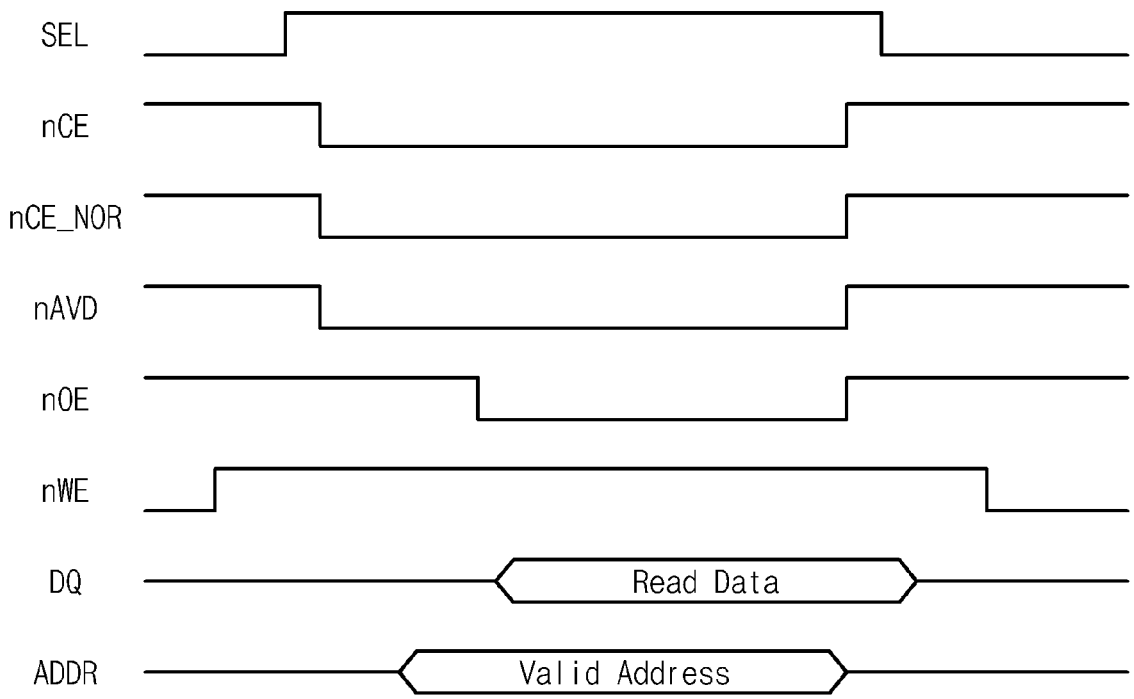
FIGS. 9 to 11 are timing diagrams further illustrating exemplary NOR area access operation for the memory system of FIG. 8.
Figure 10:
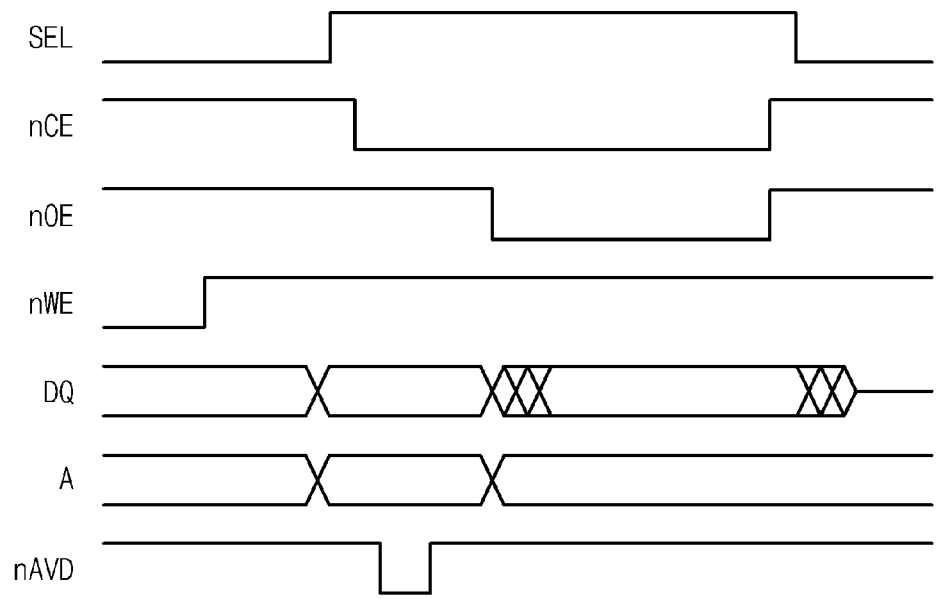

FIG. 9 through are related timing diagrams further illustrating an exemplary NOR area access operation within the memory system of FIG. 8. FIG. 9 further illustrates a read operation for NOR area 411 of FIG. 8 according to an embodiment of the inventive concept. FIG. 10 further illustrates a write operation for the NOR area 411 of FIG. 8 according to an embodiment of the inventive concept. And FIG. 11 further illustrates a synchronous burst read operation for the NOR area 411 of FIG. 8 according to an embodiment of the inventive concept.

Referring to FIG. 9, a read operation for the NOR area 411 of FIG. 8 is illustrated as an exemplary embodiment. Initially, the NOR chip enable signal nCE_NOR becomes a low level by a high-level select signal SEL and a low-level chip enable signal nCE. The control logic 470 controls an address decoder 420, a sense amplifier 455, and a data input/output buffer 460 in response to the NOR chip enable signal nCE_NOR of a low level. When an address valid input signal nAVD is at a low level, a valid address is inputted. The address decoder 420 indicates a memory cell corresponding to the inputted valid address. The sense amplifier 455 senses and amplifies data stored in the memory cell. Read data is transferred to the memory interface 480 via the data input/output buffer 460.

Figure 11:
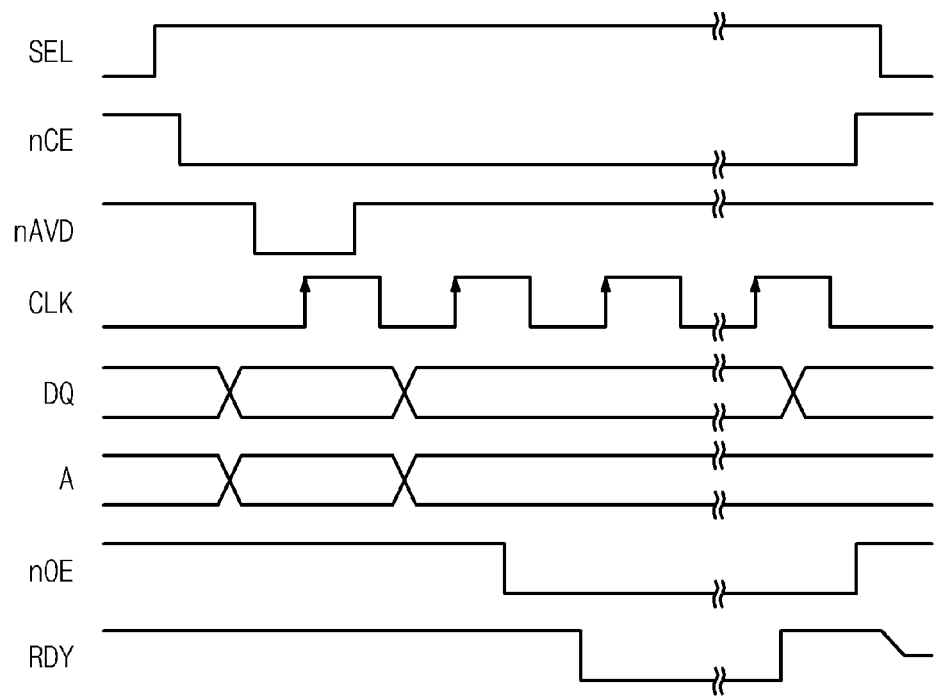

The comparative control signal waveform diagrams given in FIGS. 10 and 11 may be understood according to the foregoing description of FIGS. 8 and 9.

Figure 12:
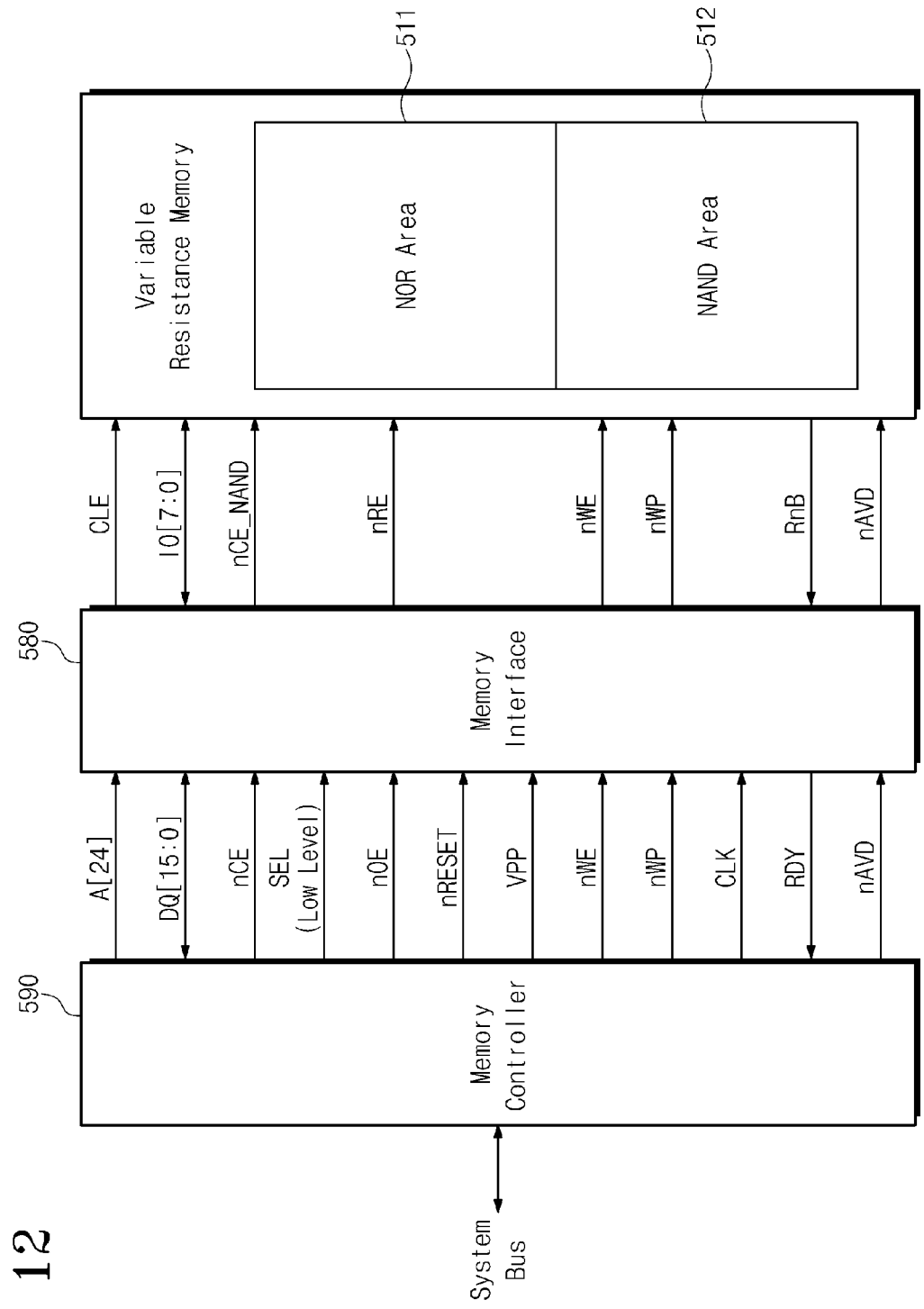
FIG. 12 is a block diagram illustrating control/address/data signals for the memory system of FIG. 6.

FIG. 12 is a block diagram illustrating control/address/data signals within the memory system of FIG. 6 while accessing a NAND area 512 of a variable resistance memory device. Referring to FIG. 12, a memory controller 590 supplies a plurality of signals to a memory interface 580 in response to an external command. In detail, the memory controller 590 supplies a plurality of signals to the memory interface 580 via address pins A[24:0], data pins DQ[15:0], a chip enable signal pin nCE, a select signal pin SEL, an output enable signal pin nOE, a reset signal pin nRESET, a write enable signal pin nWE, a write protection signal pin nWP, a clock signal pin CLK, and an address valid input signal pin nAVD. Particularly, the memory controller 590 supplies a select signal SEL of a low level to the memory interface 580 in order to access a NAND area 512 of a variable resistance memory device.

The memory interface 580 converts a plurality of signals into NAND area access signals in response to a select signal SEL of a low level. For example, the memory interface 580 converts a signal inputted via an uppermost pin A[24] of the address pins A[24:0] into a command latch enable signal CLE to supply it to the variable resistance memory device. Also, the memory interface 580 supplies an activated NAND chip enable signal nCE_NAND to the variable resistance memory device.

In other words, the memory controller 590 supplies a plurality of signals to the memory interface 580 in response to an external command. However, the plurality of signals does not conform to the NAND flash memory specification. Therefore, the memory interface 580 converts the plurality of signals into NAND area access signals in response to the select signal SEL of a low level, and supplies the converted NAND area access signals to the variable resistance memory device.

Figure 13:
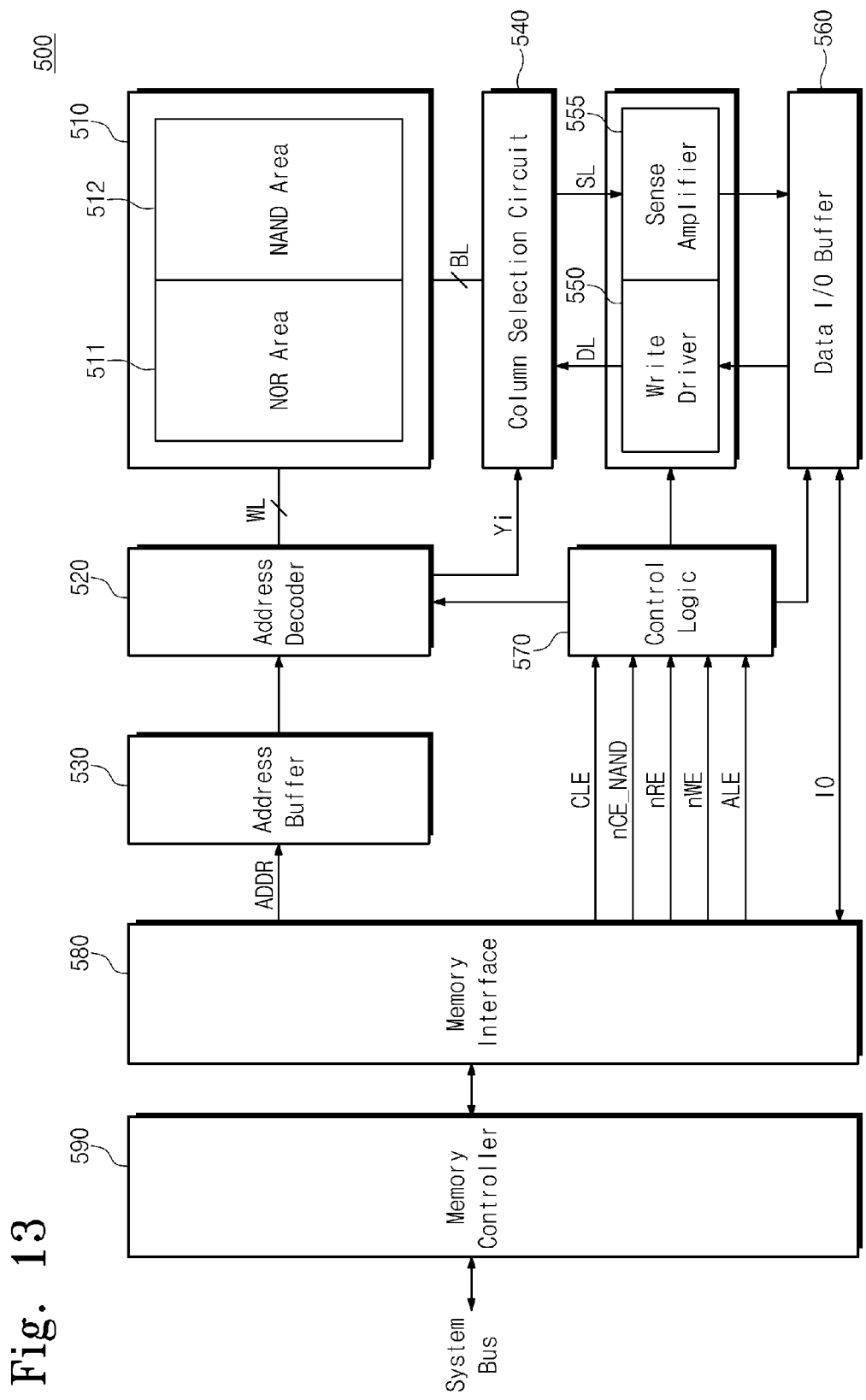
FIG. 13 is a block diagram further illustrating one possible method operable within the memory system of FIG. 6.

FIG. 13 is a block diagram illustrating one possible method operable within the memory system of FIG. 6 for accessing the NAND area of a variable resistance memory device. Referring to FIG. 13, a memory controller 590 supplies a plurality of signals to the memory interface 580 in response to an external command. In particular, the memory controller 590 supplies a select signal SEL of a low level to the memory interface 580 in order to access the NAND area 512 of the variable resistance memory device.

The memory interface 580 supplies a plurality of signals to the variable resistance memory device in response to the select signal SEL of a low level. In detail, the memory interface 580 supplies an address ADDR to the address buffer 530. And the memory interface 580 supplies a command latch enable signal, a NAND chip enable signal nCE_NAND, a read enable signal nRE, a write enable signal nWE, and an address latch enable signal ALE to the control logic 570. In particular, the memory interface 570 supplies an activated NAND chip enable signal nCE_NAND to the control logic 570.

The control logic 570 controls peripheral circuits (including an address decoder 520, a write driver 550, a sense amplifier 555, and a data input/output buffer 560) so as to access the NAND area 512 of the memory cell array, in response to the activated NAND chip enable signal nCE_NAND. Particularly, the control logic 570 outputs data to the memory interface 580 in case page data is inputted to the data input/output buffer 560. The data input/output control signal is supplied from the control logic 570. In other words, the NAND area 512 is accessed in a page unit, contrary to the NOR area 511.

Figure 14:
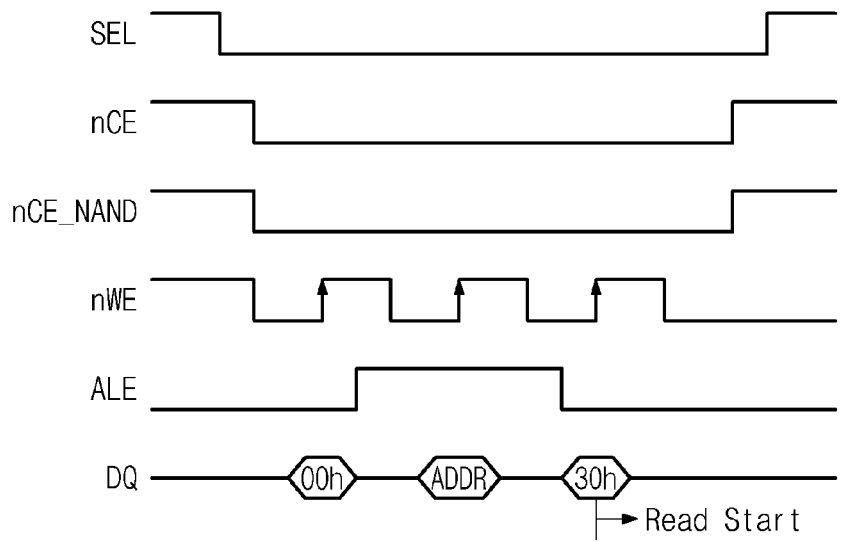
FIGS. 14 to 18 are timing diagrams further illustrating exemplary NAND area access operation for the memory system of FIG. 13.
Figure 15:
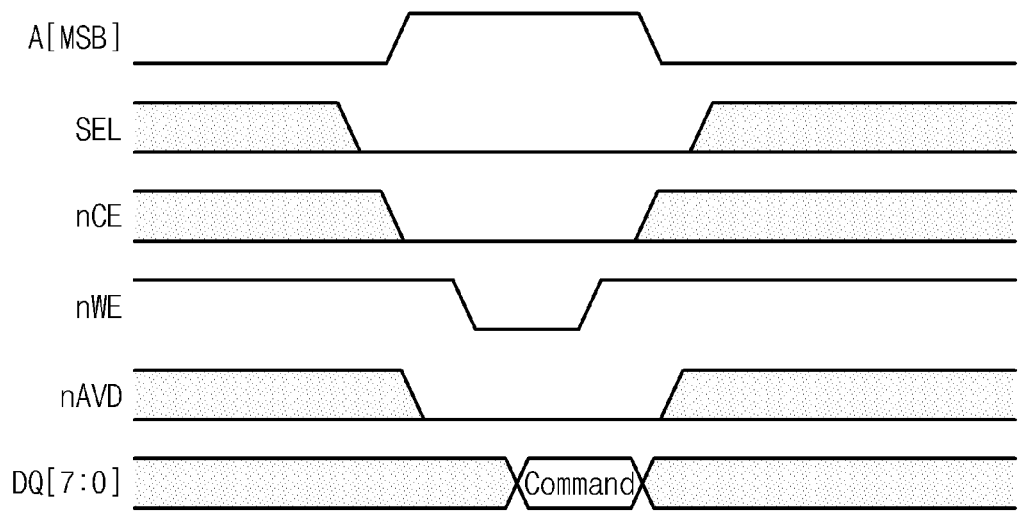
Figure 16:
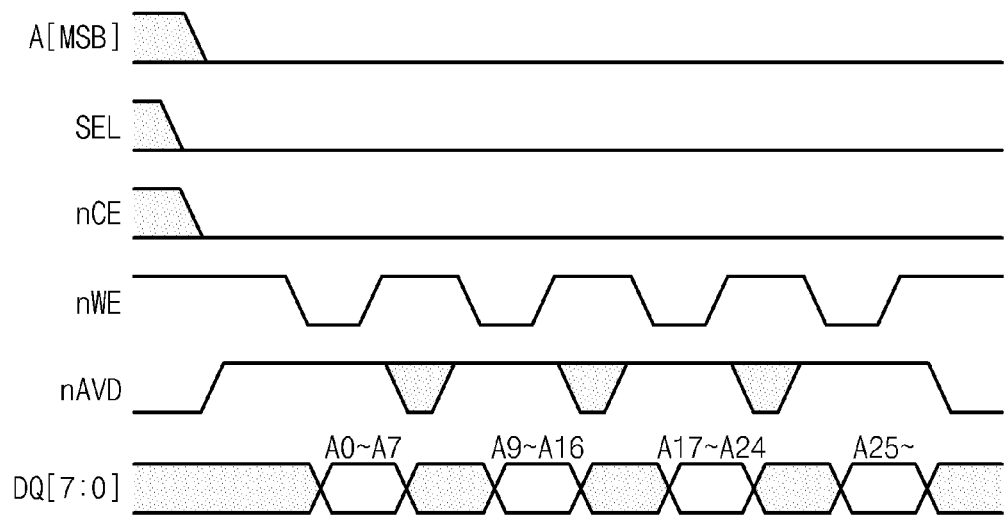
Figure 17:
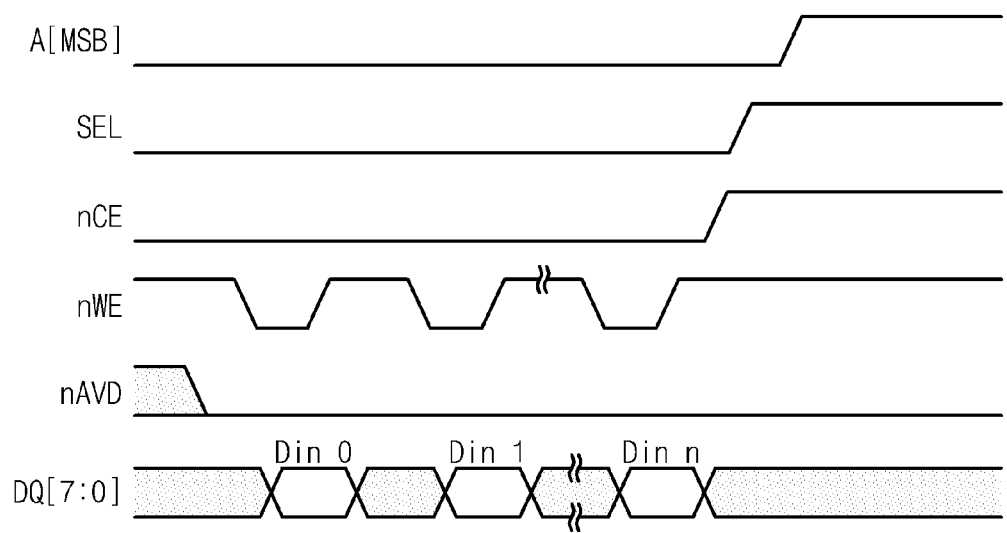
Figure 18:
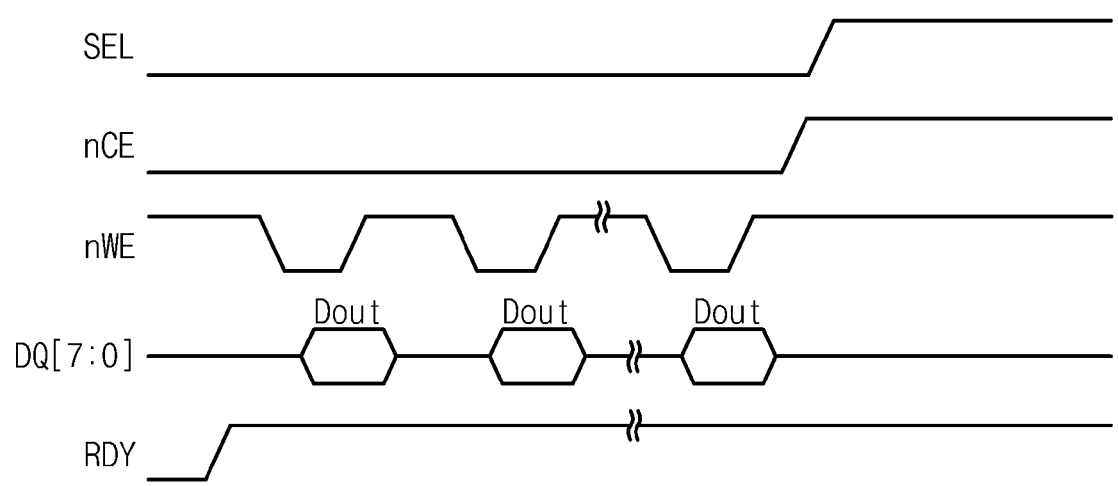

FIGS. 14 through 18 are related timing diagrams further illustrating an exemplary NAND area access operation within the memory system of FIG. 13. FIG. 14 is an exemplary embodiment of a read operation for the NAND area 512 (refer to FIG. 13). FIG. 15 is an exemplary embodiment of a command latch operation for the NAND area 512. FIG. 16 is an exemplary embodiment of an address latch operation for the NAND area 512. FIG. 17 is an exemplary embodiment of an input data latch operation for the NAND area 512. And FIG. 18 is an exemplary embodiment of a serial access operation after a read operation for the NAND area 512.

Referring to FIG. 14, a read operation for the NAND area 512 (refer to FIG. 13) is illustrated as an exemplary embodiment. Initially, a NAND chip enable signal nCE_NAND becomes a low level by a select signal SEL of a low level and a chip enable signal nCE of a low level. Control logic 570 controls an address decoder 520, a sense amplifier 555, and a data input/output buffer 560 in response to the NAND chip enable signal nCE_NAND of a low level.

Whenever a write enable signal nWE transitions from a low level to a high level, commands and address are inputted. Initially, a command 00h is inputted. When an address latch enable signal ALE is at a high state, an address ADDR is inputted. The address ADDR includes a row address and a column address. The address decoder 520 indicates a memory cell corresponding to the inputted address ADDR. And, a read operation is performed in response to a command 30h. The sense amplifier 555 senses and amplifies data stored in the memory cell. The amplified data is transferred to the memory interface 580 via the data input/output buffer 560.

The comparative control signal waveform diagrams of FIGS. 15 through 18 may be understood according to the foregoing description of FIGS. 13 and 14.

Figures 19, 20:
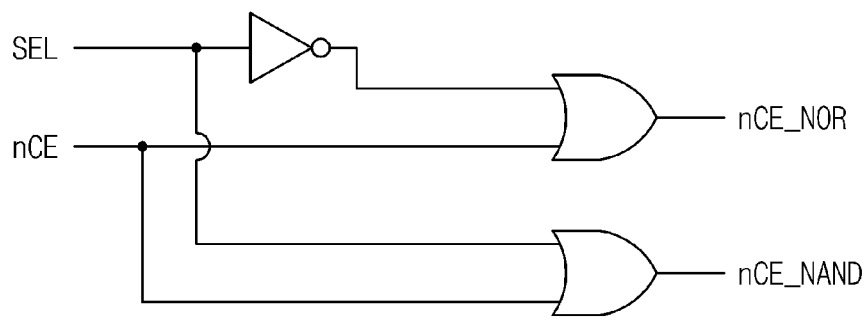
FIG. 19 is a table listing pin relationships for a NOR/NAND united interface within the memory system of FIG. 5.
FIG. 20 is a circuit diagram further illustrating on approach within the memory interface of FIG. 6 for activating a NOR chip enable signal or a NAND chip enable signal.

FIG. 19 is a table listing pin relationships for a NOR/NAND united interface within the memory system of FIG. 5 and adapted to enable access to the NOR area 211 or the NAND area 212 of the variable resistance memory device 210. Exemplary control signals for the NOR area 211 of the variable resistance memory device 210 are illustrated in FIGS. 7 and 8. And exemplary control signals for the NAND area 212 of the variable resistance memory device 210 are illustrated in FIGS. 12 and 13.

FIG. 20 is a circuit diagram illustrating one possible approach to the operation of the memory interface of FIG. 6 in activating a NOR chip enable signal or a NAND chip enable signal. A memory interface 380 (refer to FIG. 6) according to an embodiment of the inventive concept may includes the circuit illustrated in FIG. 20. Referring to FIG. 20, the memory interface 380 selectively activates the NOR chip enable signal nCE_NOR or a NAND chip enable signal nCE_NAND in response to a select signal SEL or a chip enable signal nCE. For example, when a select signal SEL of a high level and a chip enable signal nCE of a low level are inputted, the NOR chip enable signal nCE_NOR is activated. On the other hand, when a select signal SEL of a low level and a chip enable signal nCE of a low level are inputted, the NAND chip enable signal nCE_NAND is activated.

The activated NOR chip enable signal nCE_NOR or the activated NAND chip enable signal nCE_NAND is supplied to the control logic 370 to access a NOR area 311 or a NAND area 312 of the variable resistance memory device. For example, when the activated NOR chip enable signal nCE_NOR is supplied to the control logic 370, the NAND area 312 of the variable resistance memory device is accessed.

Figure 21:
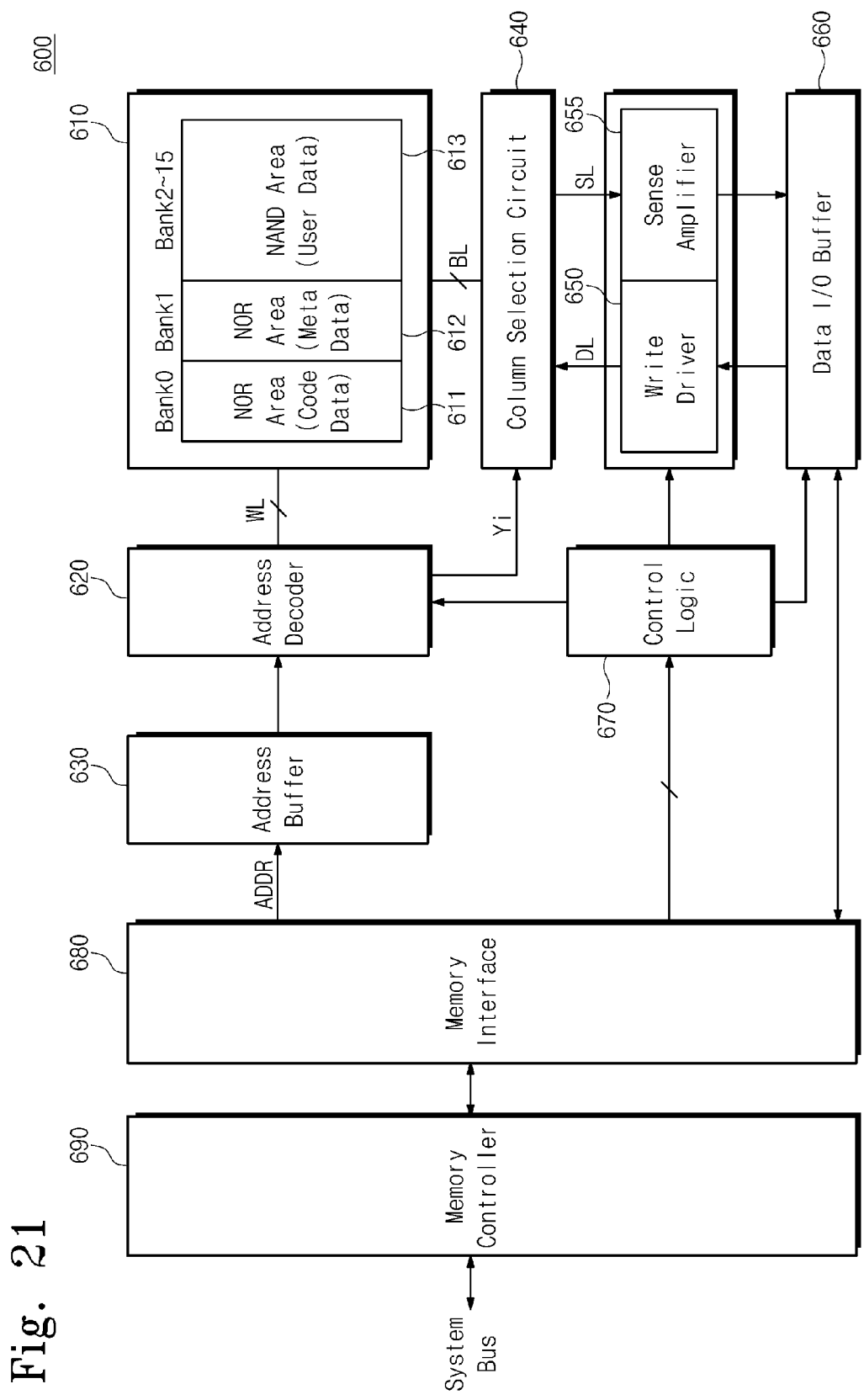
FIG. 21 is a block diagram illustrating another embodiment of a memory system according to an embodiment of the inventive concept.

FIG. 21 is a block diagram illustrating another embodiment of a memory system according to the present inventive concept. Referring to FIG. 21, a memory system 600 includes a variable resistance memory device, a memory interface 680 and a memory controller 690. The variable resistance memory device includes a memory cell array 610, an address decoder 620, an address buffer 630, a column selection circuit 640, a write driver 650, a sense amplifier 655, a data input/output buffer 660, and control logic 670.

The memory cell array 610 may be divided into a NOR area 611 for storing code data, a NOR area 612 for storing meta data, and a NAND area 613 for storing user data. In this exemplary embodiment, code data and meta data are stored in separate banks. Therefore, it is possible to perform a read while write operation. For example, it is possible to perform a read operation for code data during a write operation for meta data. Therefore, operating speed of the memory system is increased.

Figure 22:
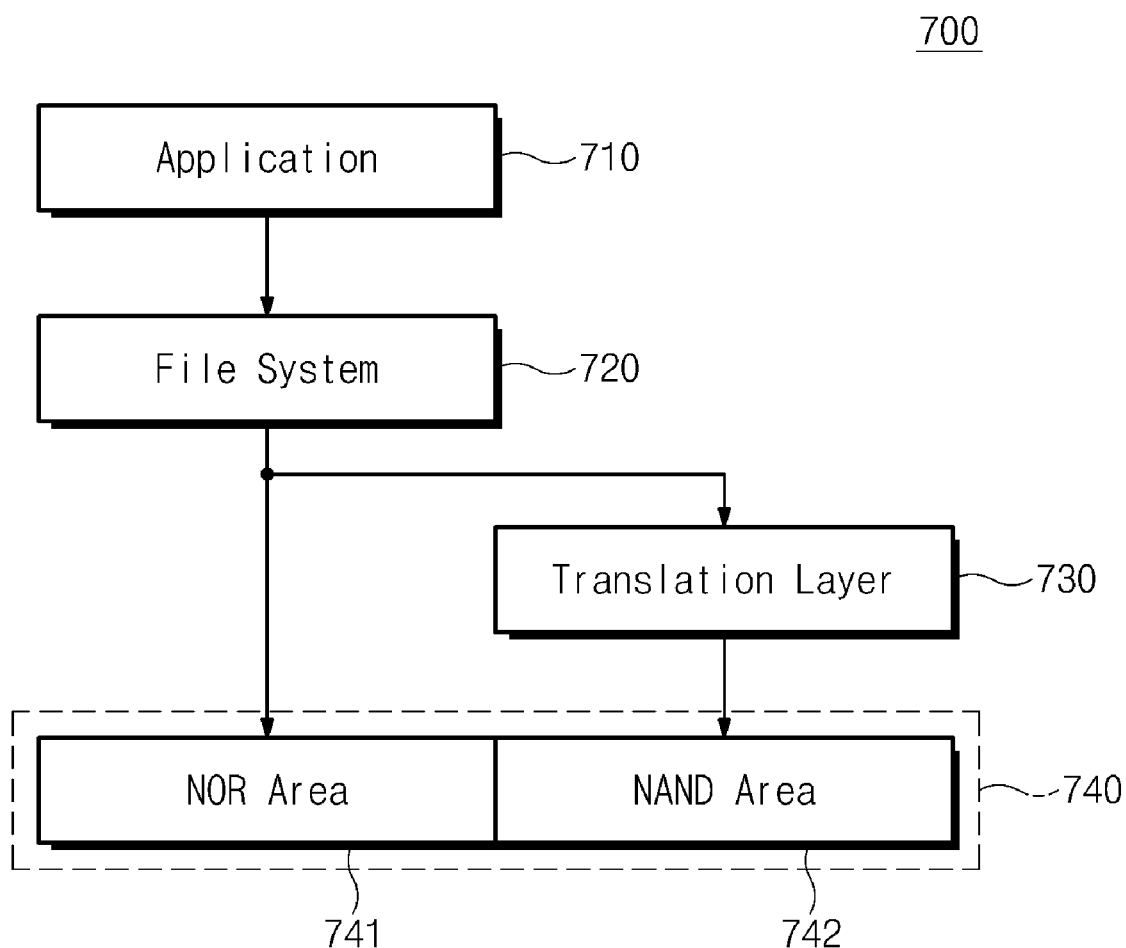
FIG. 22 is a diagram illustrating one possible software structure for the memory system according to an embodiment of the inventive concept.

FIG. 22 is a diagram illustrating one possible software structure for a memory system including the variable resistance memory device according to embodiments of the present inventive concept. Referring to FIG. 22, a memory system software structure 700 includes an application layer 710, a file system layer 720 callable by the application layer 710, a translation layer 730 callable by the file system layer 720, and a control layer associated with variable resistance memory device 740. The variable resistance memory device control layer 740 includes portions associated with the control of a NOR area 741 and a NAND area 742.

Initially, a method of accessing the NOR area 741 of the variable resistance memory device 740 is described. The file system layer 720 first receives a read, write, and erase request from the application layer 710 and transfers the addresses of sectors to be read, written, and erased to the variable resistance memory device 740. As the NOR area 741 may be accessed randomly, it may be accessed without passing through the translation layer 730.

A method of accessing the NAND area 742 of the variable resistance memory device 740 is described. The file system layer 720 first receives read, write, and erase requests from the application layer 710 and transfers addresses of sectors to be read, written, and erased to the translation layer 730. The translation layer 730 converts the addresses of the sectors into physical addresses and transfers it to the variable resistance memory device 470. As a result, the NOR area 741 of the variable resistance memory device may be accessed without using the translation layer 730, but the NAND area 742 is accessed via the translation layer 730.

The software controlling both the NOR area and NAND area of the memory system according to an embodiment of the present inventive concept may be executed by a common memory controller. Therefore, the fabrication cost of the memory system may be decreased and the integration density increased. Besides, as embodiments of the present inventive concept may be substituted with a NOR flash memory or a NAND flash memory, it may be applied to devices using flash memories, for example, memory cards and solid state drives (SSD).

Figure 23:
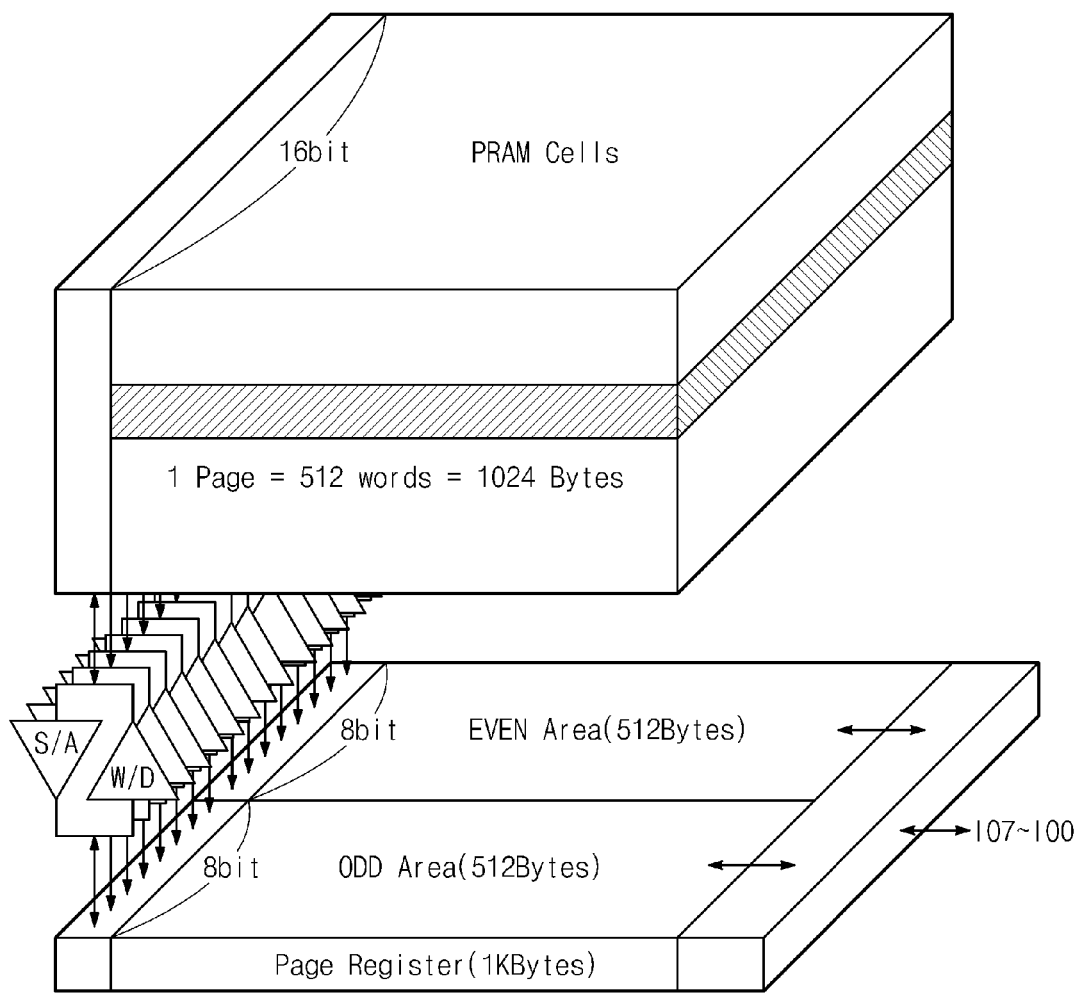
FIG. 23 is a block diagram illustrating a page mode operation of a variable resistance memory device according to an embodiment of the inventive concept.

FIG. 23 is a block diagram conceptually illustrating a page mode operation for a variable resistance memory device according to an embodiment of the inventive concept. FIG. 23 is specifically illustrated assuming the incorporation of 16-bit wide PRAM cells and contemplates the access of the NAND area 212 shown in FIG. 5. Referring to FIG. 23, the exemplary variable resistance memory device is a memory device having a page register of 1 Kbyte divided into ODD and EVEN areas. This example will now be described below in some additional detail.

Assuming a data read operation, the variable resistance memory device simultaneously reads 16-bit data through 16 sense amplifiers and stores high 8-bit and low 8-bit in the ODD area and the EVEN area, respectively. After storing data in the ODD and EVEN areas of the page register, the variable resistance memory device sequentially reads the data through a pin I/O[7:0]. If the variable resistance memory device supports a burst synchronous read mode of 8-word pre-fetch, page read time is computed as follows: [tREAD_page=tREAD_word×512/8].

Assuming a data programming operation, the variable resistance memory device sequentially store the data in the page register through the pin I/O[7:0]. The variable resistance memory device programs the data stored in the ODD and EVEN areas to a memory cell through 16 write drivers by 16-bit unit in ×2, ×4 or ×8 mode. The program time is computed as follows: [tPGM_page=tPGM_word×512].

Figure 24:
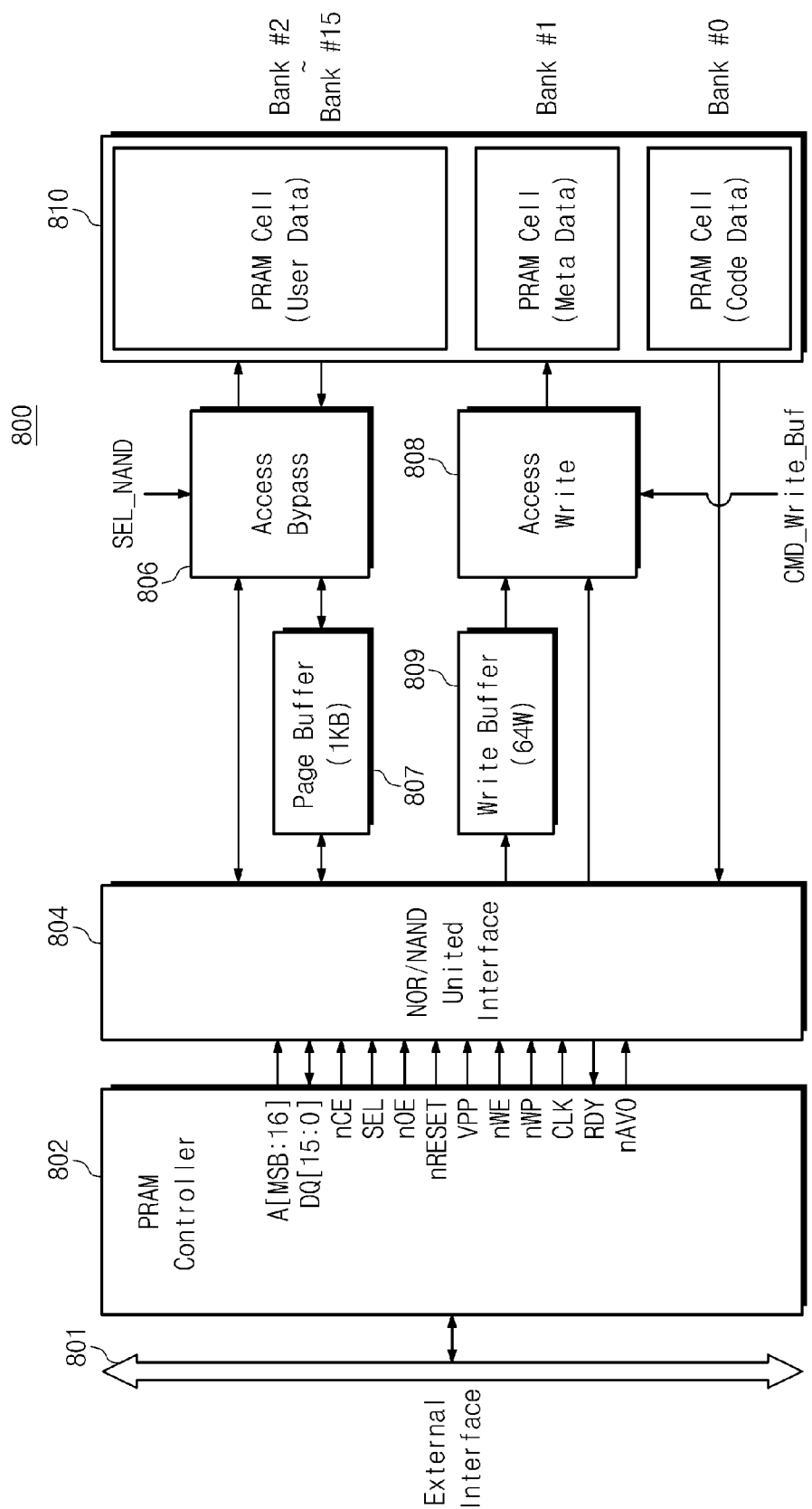
FIG. 24 is a block diagram illustrating a memory system according to another exemplary embodiment of the inventive concept.

FIG. 24 is a block diagram illustrating a memory system 800 according to another embodiment of the inventive concept. The memory system 800 comprises an array of PRAM cells 810 divided into multiple Banks Access to the array of PRAM cells 810 is controlled by a PRAM controller 802 interfacing with an external interface 801. External data, command, address, and control signals (or packets) communicated to the PRAM controller 802 via the external interface 801 generate corresponding internal data, command, address and control signals of the type previously described. At least the data (DQ), address (A) and control signals generated by PRAM controller 802 are applied to a NOR/NAND United Interface 804. Via the NOR/NAND United Interface 804 write data access to the array of PRAM cells is facilitated by write buffer 809 and access write circuit 808. Via the NOR/NAND United Interface 804 read data access to the array of PRAM cells is facilitated by page buffer 807 and access bypass circuit 806. In the illustrated example of FIG. 24, specific data types (e.g., user data, meta data, and code data) are segregated according to one or more memory banks (e.g., memory banks #0 through #15).

That is, referring to FIG. 24, the PRAM cell 810 is divided into a user data area, a meta data area, and a code data area. The user data area may operate in a flexible program mode. That is, the memory system 800 may use set data "0" as a background data during an erase operation for the user data area and use reset data "1" during a program operation for the user data area. The memory system 800 may perform an erase operation according to a block erase mode, perform a program operation according to a page write mode of high capacity over 1 Kbytes, perform a read operation according to a page read mode of high capacity over 1 Kbytes.

The memory system 800 may perform a random access write operation or a random access read operation for the code and meta data areas. Furthermore, the memory system 800 may perform a buffer write operation of low capacity below 128 bytes for the code and meta data areas. These operation modes may be controlled through an MRS command or system software command.

FIG. 25 is a table listing certain operating modes for the memory system 800 shown in FIG. 24. The memory system may select a page buffer scheme of a NAND interface through a signal SEL_NAND and select a write buffer scheme of a NOR interface through a signal CMD_Write_Buf.

For example, in an Internet server environment, a plurality of users may access memory simultaneously, and packet data is transferred by server(s) in a time-sharing manner. Most users write data at random when they access the memory. However, a write or erase operation of page data is required to effectively control access of the memory by the sever.

As set forth in FIG. 24, a resistance variable memory device according to an embodiment of the inventive concept may erase a memory cell with background data through a chip erase operation, a block erase operation or a page erase operation and program only specific data during an erase operation. Published U.S. patent application Ser. No. 12/318,241 discloses such an examples and is hereby incorporated by reference. Various embodiments of a variable resistance memory device performing a chip or block erase operation will now be described below in some additional detail.

Figure 26:
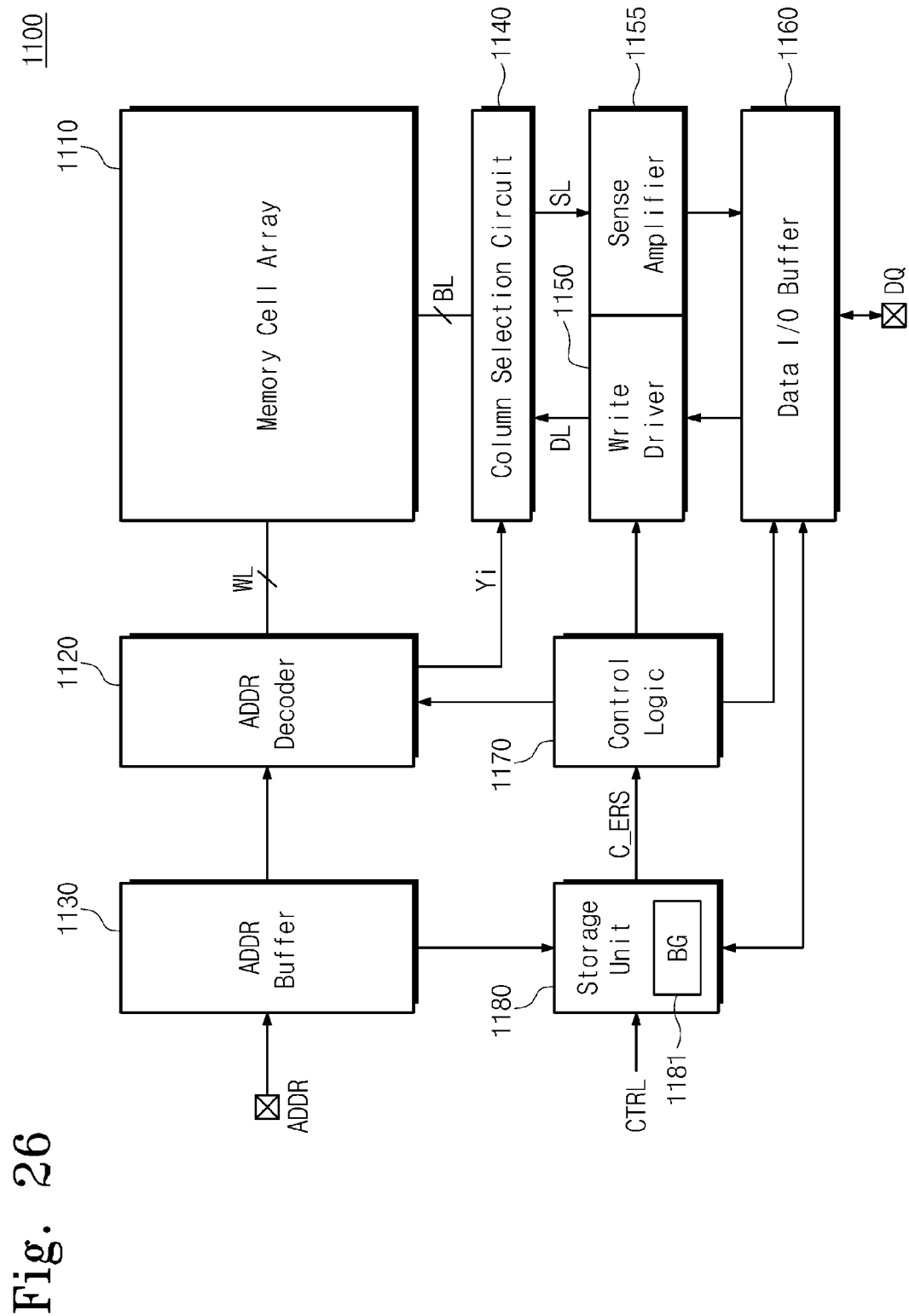
FIG. 26 is a block diagram of a variable resistance memory device performing a chip erase operation according to an embodiment of the inventive concept.

FIG. 26 is a block diagram of a variable resistance memory device 1100 configured to perform a chip erase operation according to an embodiment of the inventive concept. As illustrated, the variable resistance memory device 1100 comprises a memory cell array 1110, an address decoder 1120, an address buffer 1130, a column selection circuit 1140, a write driver 1150, a sense amplifier 1150, a data input/output buffer (data I/O buffer) 1160, a control logic 1170, and a storage unit 1180.

Figure 1:
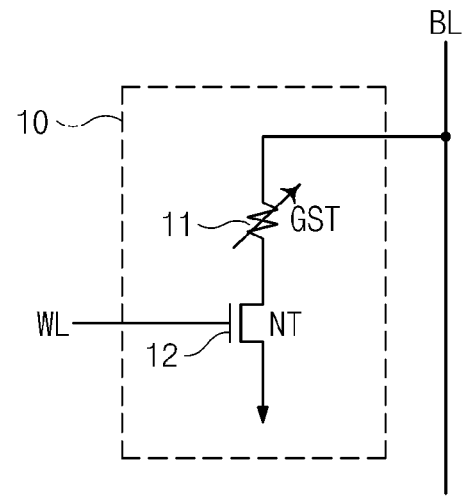
FIG. 1 and FIG. 2 illustrate a memory cell of a variable resistance memory device.
Figure 2:
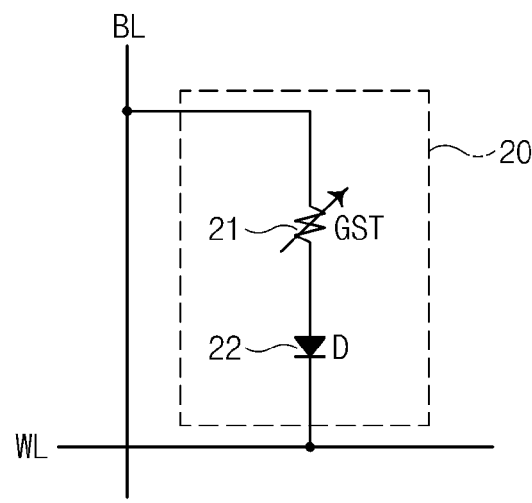
Figure 3:
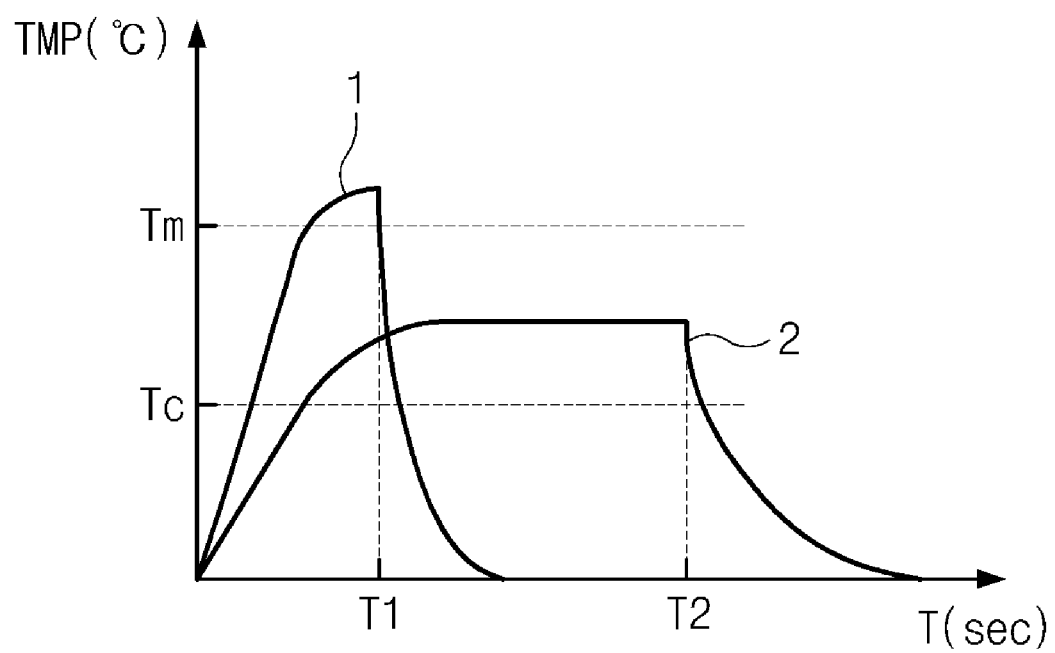
FIG. 3 is a graph for illustrating characteristics of the variable resistance material of FIGS. 1 and 2.
Figure 4:
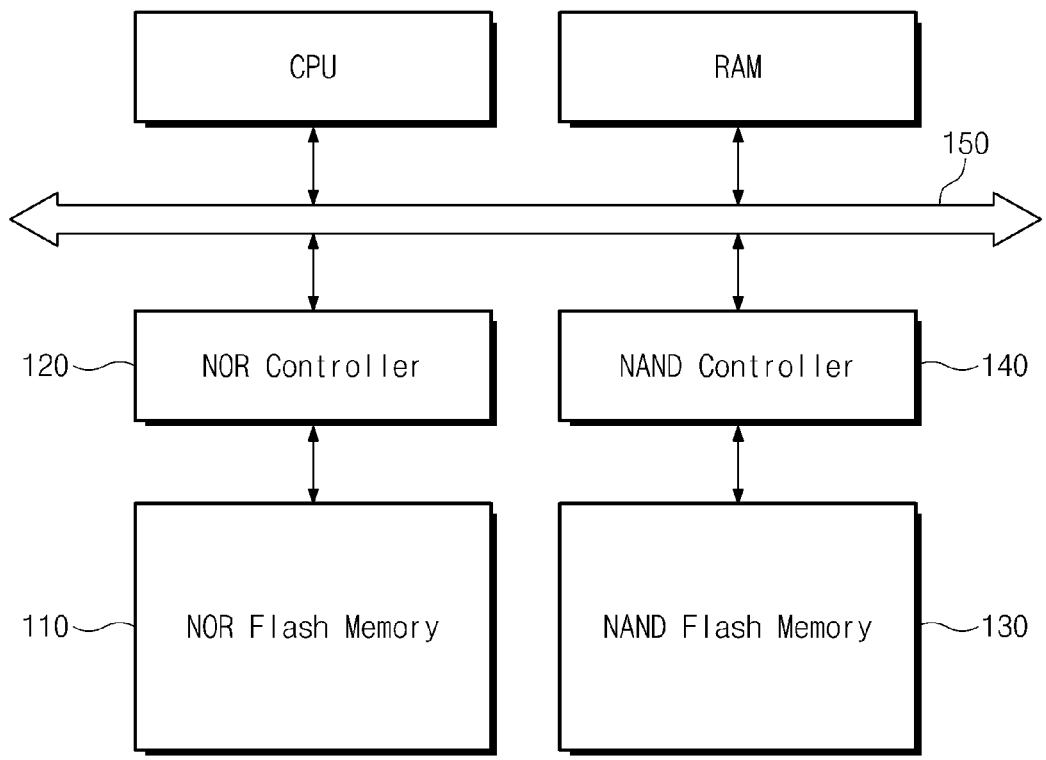
FIG. 4 is a block diagram of a general computer system including a NOR flash memory and a NAND flash memory.

The memory cell array 1110 includes a plurality of memory cells. For example, each memory cell comprises a memory element and a select element, as shown in FIGS. 1 and 2. The memory element includes a variable resistance material (GST), and the select element comprises a transistor NT or a diode D.

The address decoder 1120 is connected to the memory cell array 1110 through a wordline WL. The address decoder 1120 decoders an external address ADDR and provides a bias voltage to a selected wordline. The address decoder 1120 generates a select signal Yi for selecting a bitline BL. The select signal is provided to the column selection circuit 1140. The address buffer 1130 receives the external address ADDR and provides the received address ADDR to the address decoder 1120 and the storage unit 1180.

The column selection circuit 1140 is connected to the memory cell array 1110 through the bitline BL. The bitline selection circuit 1140 selects a bitline in response to the select signal Yi provided from the address decoder 1120. In response to the selection signal Yi, the column selection circuit 1140 connects the bitline BL to a data DL during a write operation and connects the bitline BL to a sense line SL during a read operation.

The write driver 1150 receives a pulse control signal and provides a program current to the data line DL. The pulse control signal is provided from the control logic 1170. A program pulse includes set current for programming data "0" to a memory cell and reset current for programming data "1" to a memory cell. During an MLC program operation, the write driver 1150 provides program current once or more times according to a multi-state of a memory cell.

In response to a pulse control signal, the write driver 1150 erases all memory cells in the memory cell array 1110 with background data during an erase operation. At this point, the background data may be "0" (or set state) or "1" (or reset state). That is, the write driver 1150 erases all memory cells with either one of data "0" and data "1" during the erase operation.

In response to the pulse control signal, the write driver 1150 programs a selected memory cell in the memory cell array 1110 during a program operation. Program data is "1" when the background data is "0", while being "0" when the background data is "1". The configuration and operation principle of the write driver 1150 will be described in detail later with reference to FIG. 35.

The sense amplifier 1155 senses a difference between a voltage of the sense line SL and a reference voltage during the read operation to read the data stored in the selected memory cell. The reference voltage is provided from a reference voltage generator circuit (not shown). The sense amplifier 1155 operates in response to a control signal provided from the control logic 1170.

The data I/O buffer 1160 receives data from an input/output terminal DQ or outputs data to the input/output terminal DQ. The number of input/output terminals DQ varies with the kind of the variable resistance memory device 1100. In response to a data input/output signal, the data I/O buffer 1160 provides data to the write driver 1150 or outputs data read out of the sense amplifier 1155 to the exterior. The data input/output signal is provided from the control logic 1170.

The control logic 1170 controls write, read, and erase operations of the variable resistance memory device 1100. During the erase operation, the control logic 1170 generates a pulse control signal in response to a chip erase signal C_ERS. The write driver erases all memory cells with background data in response to a pulse control signal. During the write operation, the control logic 1170 programs a selected memory cell in response to a program signal (PGM in FIG. 32).

The storage unit 1180 stores background information (BG) 1181. The storage device 1180 may store the BG 1181 through mode register setting (MRS) or fuse setting. The BG 1181 is information for erasing all memory cells in the memory cell array 1110 with background data during an erase operation.

The storage unit 1180 receives an address ADDR, data DQ, and a control signal CTRL and stores the BG 1181. The control signal CTRL implies a chip enable signal nCE, a write enable signal nWE or the like. According to the combination of control signals CTRL, the storage device 1180 receives the address ADDR and the data DQ and generates an erase command or a program command.

The storage unit 1180 generates the chip enable signal C_ERS during an erase operation. For example, the storage unit 1180 receives the address ADDR and the data DQ according to transition of the write enable signal nWE, stores the background information (BG) 1181 through mode register setting (MRS), and generates the chip erase signal C_ERS. The operation of the storage unit 1180 will now be described below in detail with reference to FIG. 27.

Figure 27:
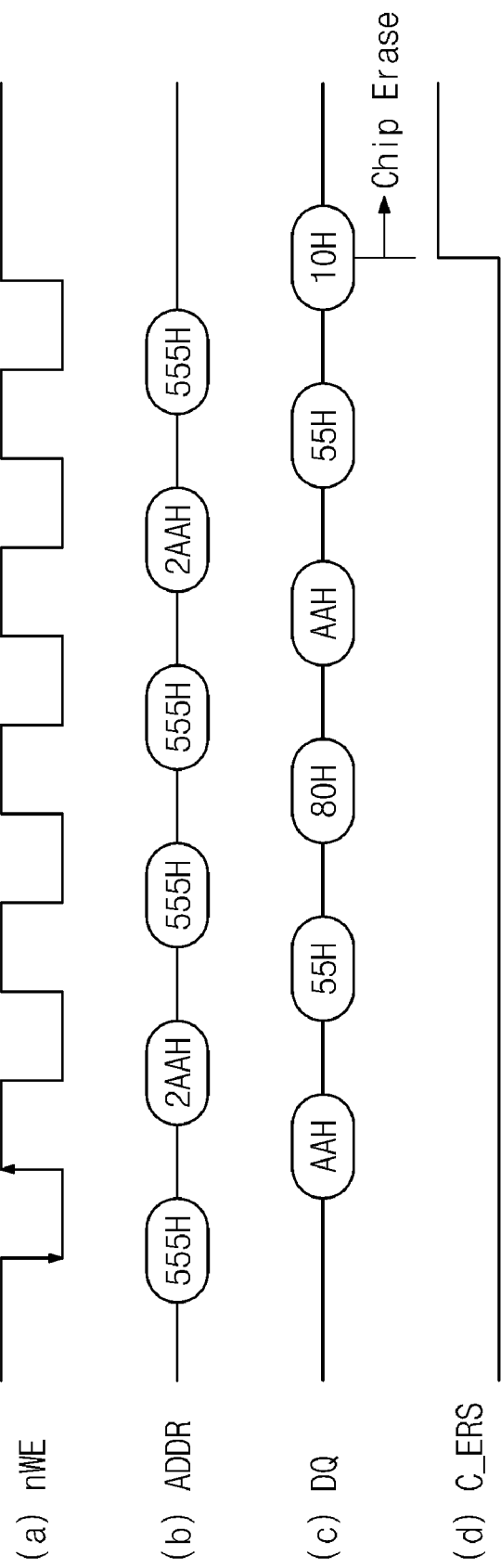
FIG. 27 is a timing diagram further illustrating the chip erase operation for the variable resistance memory device shown in FIG. 26.

FIG. 27 is a timing diagram further illustrating the chip erase operation for the variable resistance memory device 1100 shown in FIG. 26. Referring to FIG. 27, the variable resistance memory device 1100 needs a write enable signal nWE having six cycles to perform the chip erase operation.

The variable resistance memory device 1100 receives the address ADDR for each high-to-low transition of the write enable signal nWE and the data DQ for each low-to-high transistor thereof. An erase setup command 80H is applied when two cycles pass. The chip enable signal C_ERS is generated in response to a chip erase command.

There are various manners to store background information in the storage (1180 in FIG. 26). For example, as shown in FIG. 27, background information may be stored as "0" when a chip erase command is 10H and stored as "1" when the chip erase command is 11H. After the chip erase command is input, the background information may be stored in the storage unit 1180 by using a separate cycle.

The variable resistance memory device 1100 performs a chip erase operation according to the chip erase signal C_ERS. The chip erase signal C_ERS is provided to the control logic 1170. The control logic 1170 generates a pulse control signal for the chip erase operation in response to the chip erase signal C_ERS. The variable resistance memory device 1100 erases all memory cells in the memory cell array 1110 with the background data according to the chip erase operation.

Figure 28:
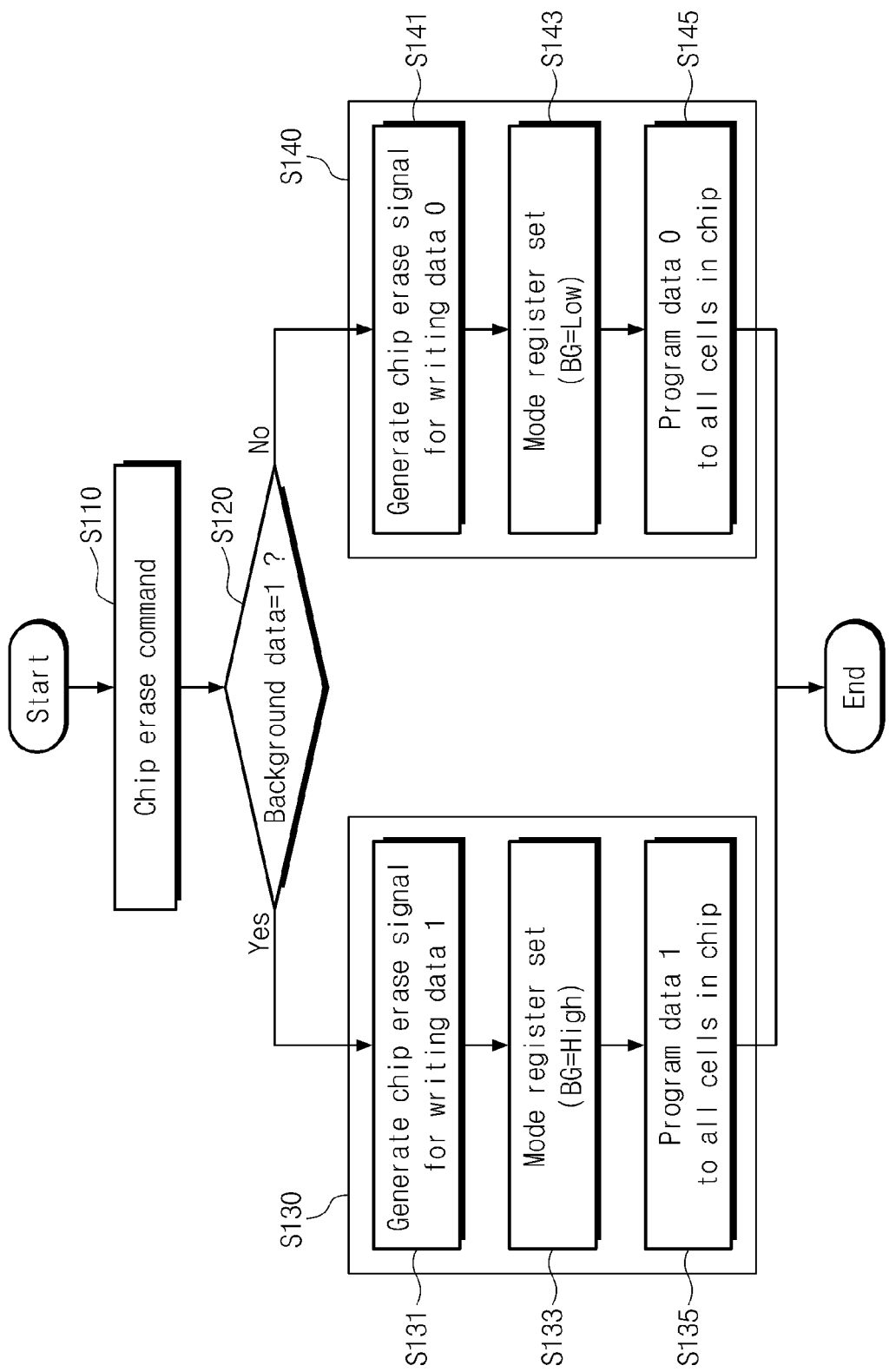
FIG. 28 is a flowchart summarizing a chip erase operation for the variable resistance memory device shown in FIG. 26.

FIG. 28 is a flowchart summarizing the chip erase operation for the variable resistance memory device 1100 shown in FIG. 26. The variable resistance memory device 1100 is assumed to erase all memory cells in the memory cell array 1110 using the chip erase operation.

At S110, a chip erase command 10H is applied to the variable resistance memory device 1100. At S120, it is determined whether background data is "1". The storage unit 1180 determines whether the background data is "1", by using the chip erase command 10H or subsequently applied data.

If the background data is "1", an operation is performed to erase all the memory cells in the memory cell array 1110 to data "1" (S130). At S131, a chip erase signal C_ERS for writing the data "1" is generated. At S133, background information (BG) is stored in a storage through mode register setting (MRS). At this point, the BG is set to a high level. At S135, the data "1" is programmed to all memory cells in a chip. That is, the background data "1" is programmed to all the memory cells in the memory cell array 1110.

On the other hand, if the background data is "0", an operation is performed to erase all memory cells in the memory cell array 1110 to data "0" (S140). At S141, a chip erase signal C_ERS for writing the data "0" is generated. At S143, background information (BG) is stored in a storage through mode register setting (MRS). At this point, the BG is set to a low level. At S145, the data "0" is programmed to all memory cells in a chip. That is, the background data "0" is programmed to all the memory cells in the memory cell array 1110.

Returning to FIG. 26, the variable resistance memory device 1100 erases all memory cells to background data before programming data. According to the illustrated embodiment of the inventive concept, write speed may be improved during a program operation. Especially in a case of a phase change memory device, a selected memory cell is programmed to a reset state (or program data "1") during a program operation when all memory cells are erased to a set state (or background data "0"). Therefore, write speed is considerably improved.

Figure 29:
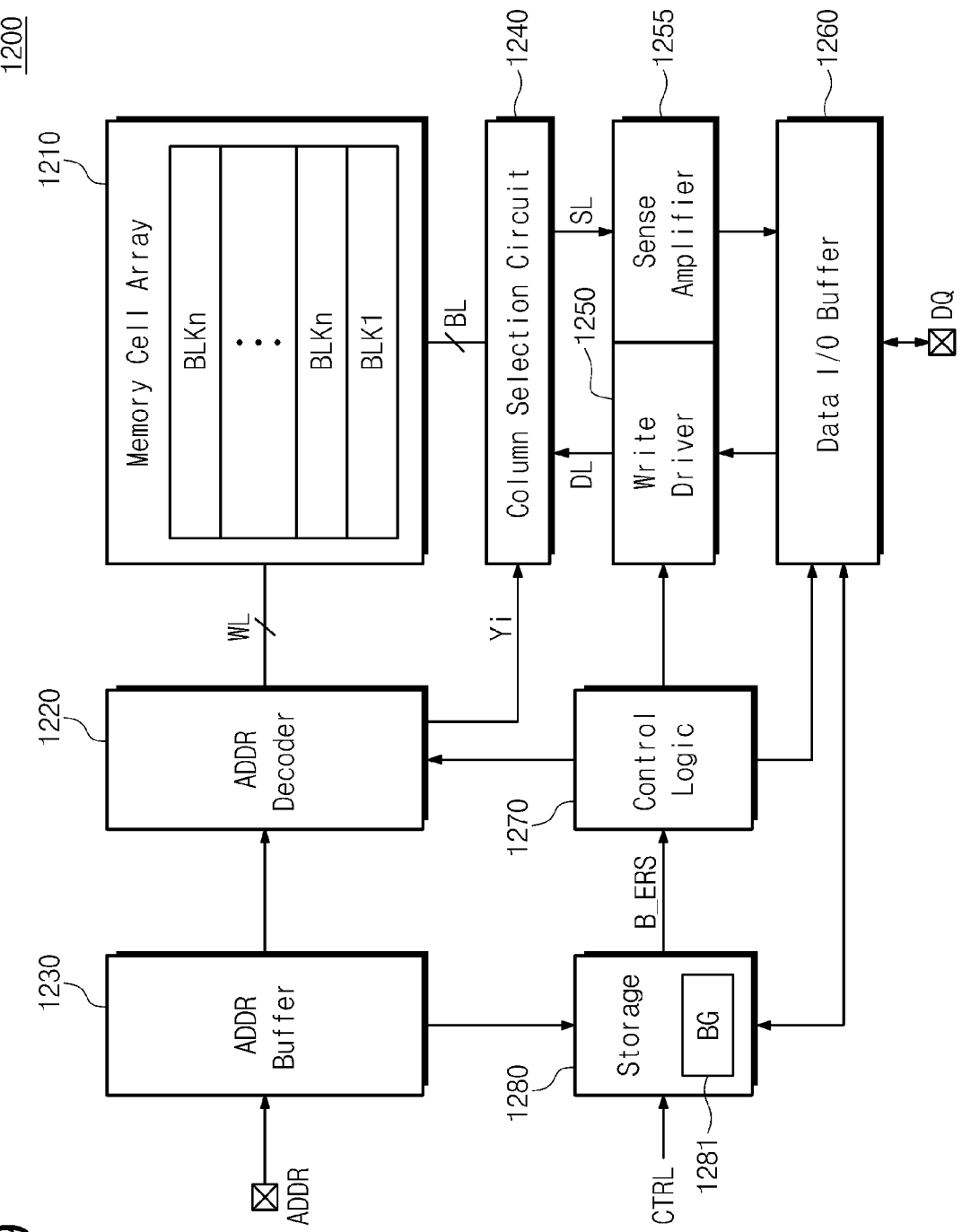
FIG. 29 is a block diagram of a variable resistance memory device performing a block erase operation according to an embodiment of the inventive concept.

FIG. 29 is a block diagram of a variable resistance memory device 1200 performing a block erase operation according to an embodiment of the inventive concept. As illustrated, the variable resistance memory device 1200 comprises a memory cell array 1210, an address decoder 1220, an address buffer 1230, a column selection circuit 1240, a write driver 1250, a sense amplifier 1255, a data input/output buffer (data I/O buffer) 1260, a control logic 1270, and a storage 1280.

The memory cell array 1210 includes a plurality of memory blocks BLK1~BLKn each including a plurality of memory cells. Each of the memory cells has a resistance varying with a program state of a variable resistance material (GST). The variable resistance memory device 1200 according to the inventive concept performs a block erase operation by the unit of block. The block erase operation of the variable resistance memory device 1200 will be described in detail later.

The address decoder 1220 is connected to the memory cell array 1210 through a wordline WL. The address decoder 1220 generates a select signal Yi for selecting a bitline BL. The address buffer 1230 receives an external address ADDR and provides the received address ADDR to the address decoder 1220 and the storage 1280. The column selection circuit 1240 is connected to the memory cell array 1210 through the bitline BL.

The write driver 1250 receives a pulse control signal and programs a memory cell to data "0" or "1". The write driver 1250 erases all memory cells in a corresponding memory block to background data in response to a pulse control signal. In response to the pulse control signal, the write driver 1250 programs a selected memory cell in the corresponding memory block during a program operation.

The sense amplifier 1255 reads data stored in the selected memory cell during a read operation. The data I/O buffer 1260 receives data from an input/output terminal DQ or outputs data to the input/output terminal DQ. In response to a block erase signal B_ERS, the control logic 1270 generates a pulse control signal during an erase operation. The write driver 1250 erases a corresponding memory block to background data in response to a pulse control signal.

The storage 1280 stores background information (BG) 1281 on each memory block. For example, the storage 1280 stores background information in which a first data block BLK1 is erased to data "0" and a second data block BLK2 is erased to data "1". The background information may be stored through mode register setting (MRS) or fuse setting.

The storage 1280 receives an address ADDR, data DQ, and a control signal CTRL, stores background information (BG) 1281, and generates a block erase signal B_ERS. A block erase operation of the storage 1280 will now be described below with reference to FIGS. 30 and 32.

Figure 30:
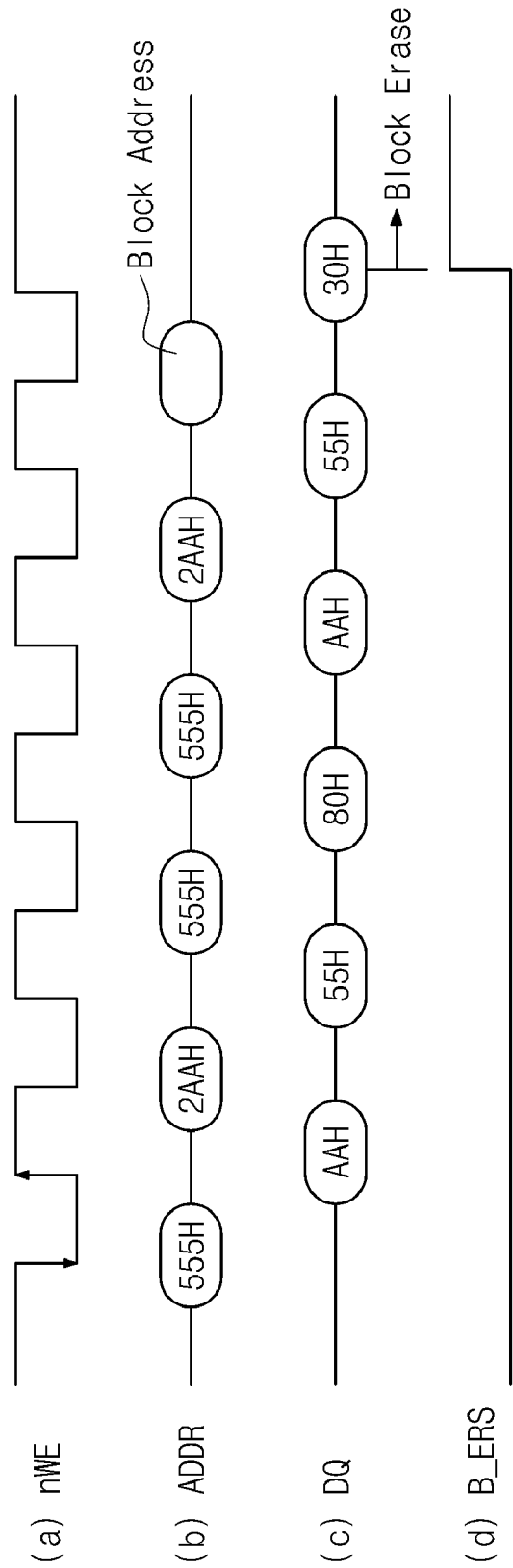
FIG. 30 is a timing diagram further illustrating the block erase operation for the variable resistance memory device shown in FIG. 29.
Figure 32:
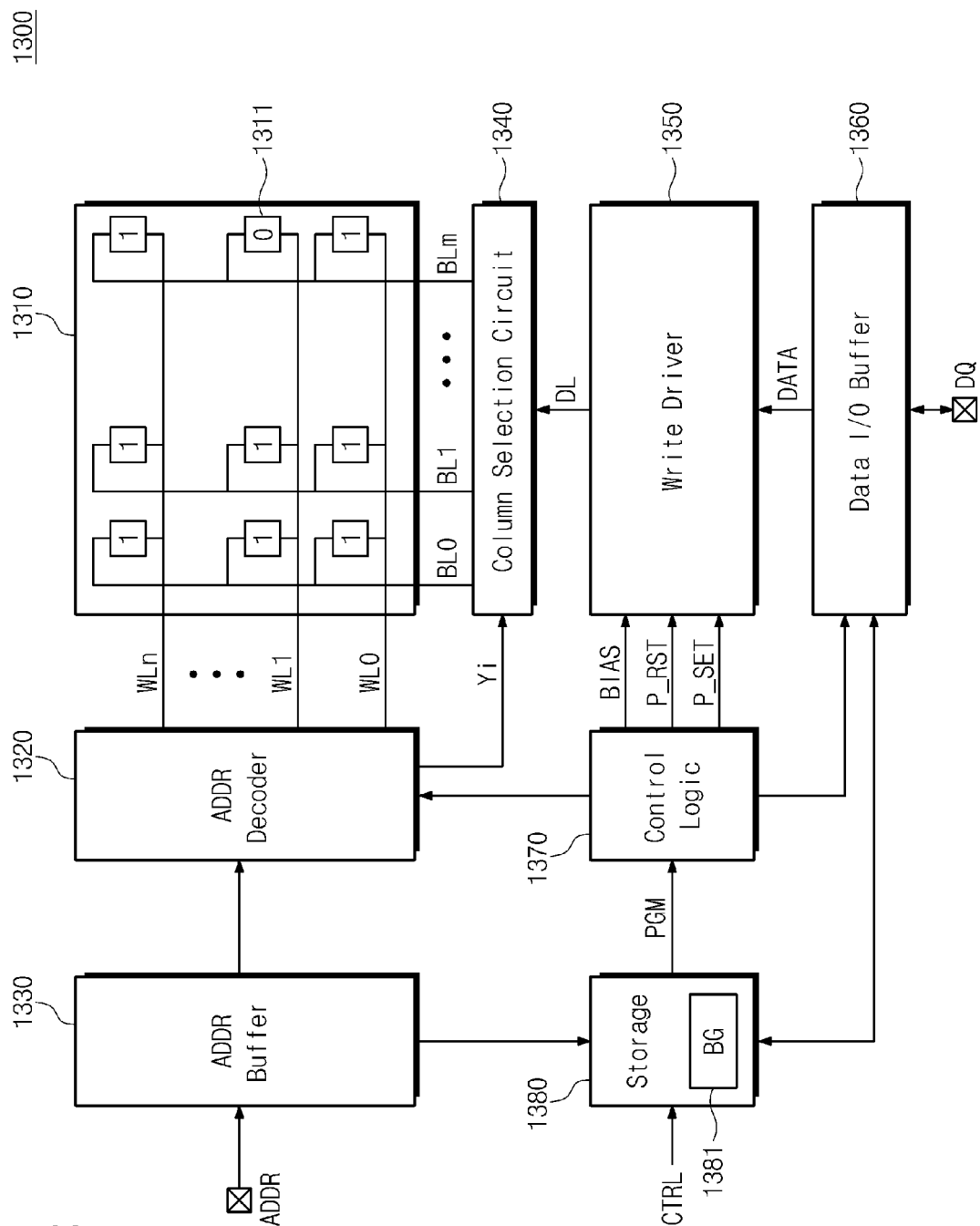
FIG. 32 is a block diagram illustrating a flexible program operation for a variable resistance memory device according to an embodiment of the inventive concept.

FIG. 32 is a block diagram further illustrating a flexible program operation of the variable resistance memory device 1200 according to an embodiment of the inventive concept. Referring to FIG. 30, an erase setup command 80H is applied when two cycles pass. A block address and block erase command 30H is applied when two cycles pass after the erase setup command 80H is input. A block erase signal B_ERS is generated in response to a block erase command.

The variable resistance memory device 1200 is configured to generate the block erase signal B_ERS and store background information (BG) 1281 in a storage device 1280. The block erase signal B_ERS is provided to a control logic 1270. In response to the block erase signal B_ERS, the control logic 1270 performs a block erase operation. The variable resistance memory device 1200 erases all memory cells n a corresponding memory block to background data according to the block erase operation.

Figure 31:
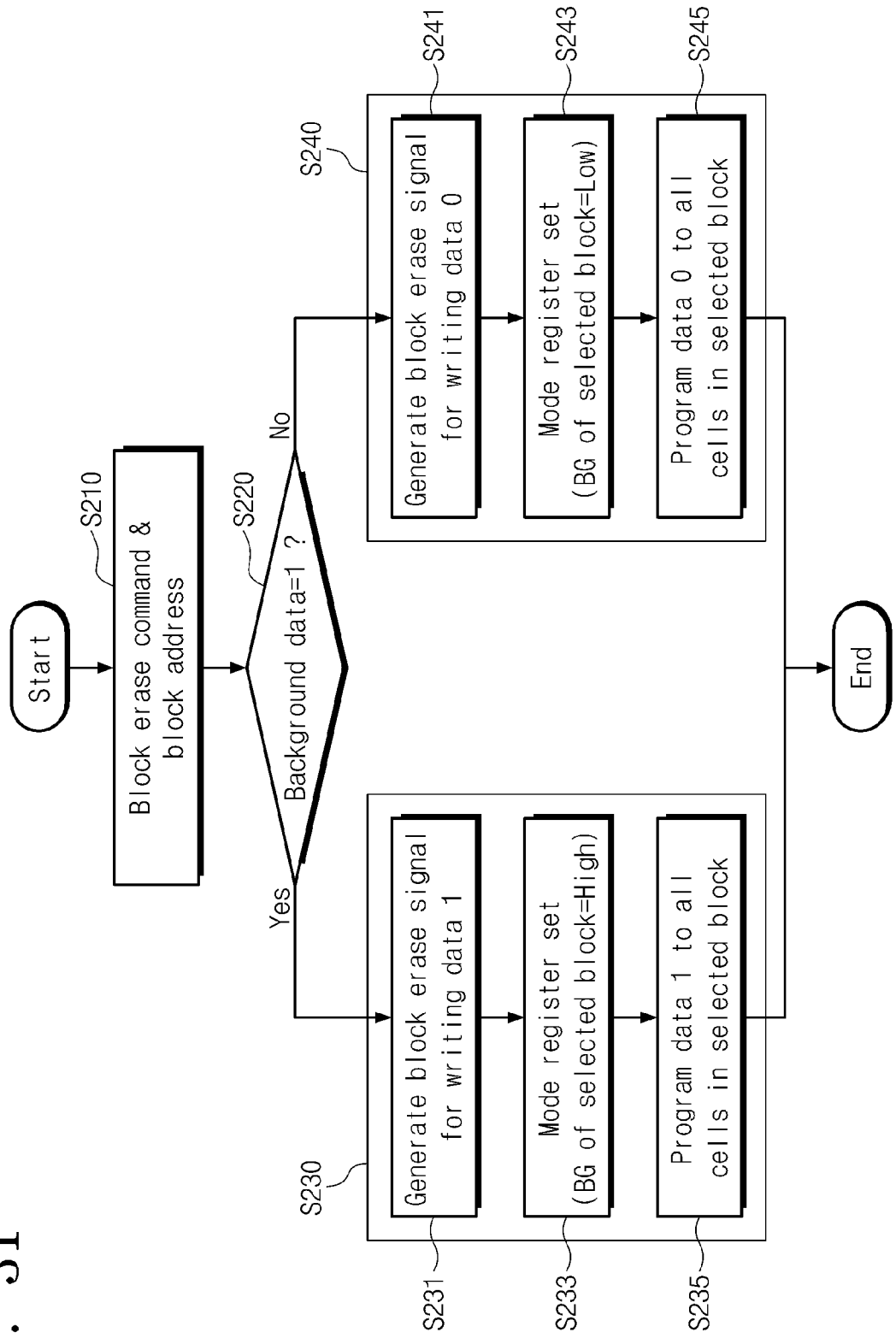
FIG. 31 is a flowchart summarizing the block erase operation for the variable resistance memory device shown in FIG. 29.

FIG. 31 is a flowchart summarizing the block erase operation of the variable resistance memory device 1200 shown in FIG. 29. The variable resistance memory device 1200 performs an erase operation by the unit of block through a block erase operation.

At S210, a block address and block erase command is applied to the variable resistance memory device 1200. At S220, it is determined whether background data of a corresponding memory block is "1". The storage 1280 determines whether background data is "1", by using a block erase command or subsequently applied data.

If the background data is "1", an operation is performed to erase all memory cells in a selected memory block to the data "1" (S230). At S231, a block erase signal B_ERS for writing the data "1" is generated. At S233, background information (BG) 1281 is stored in the storage 1280 through mode register setting (MRS). At this point, the BG is set to a high level. At S235, the data "1" is programmed to all the memory cells in the selected memory block. That is, all the memory cells in the selected memory block are erased to the background data "1".

On the other hand, if the background data is "0", an operation is performed to erase all memory cells in the selected memory block to data "0" (S240). At S241, a block erase signal B_ERS for writing the data "0" is generated. At S243, background information (BG) 1281 is stored in a storage through mode register setting (MRS). At this point, the BG is set to a low level. At S245, the data "0" is programmed to all memory cells in a chip. That is, the background data "0" is programmed to all the memory cells in the memory cell array 1110.

Returning to FIG. 29, the variable resistance memory device 1200 erases all memory cells to background data before programming data. According to the illustrated embodiment of the inventive concept, write speed may be improved during a program operation. Especially in case of a phase change memory device, a write speed is considerably improved during a program operation when background data is "0". This is because a typical phase change memory device requires longer time for programming a memory cell to a set state than that for programming a memory cell to a reset state.

A flash memory device programs a selected memory cell after erasing all memory cells in a memory block. That is, the flash memory programs data "0" to a selected memory cell after programming background data "1" to all memory cells.

A variable resistance memory device according to the inventive concept is compatible with a flash memory device by performing a block erase operation. According to the present inventive concept, because all memory cells in a memory block are erased to background data before being programmed and a selected memory cell is programmed during the program operation, the variable resistance memory device is compatible with a flash memory. Thus, the present inventive concept may be applied to a memory card using a flash memory device, a solid-state disk (SSD), and so forth.

As previously noted, FIG. 32 is a block diagram illustrating a flexible program operation of a variable resistance memory device 1300 according to an embodiment of the inventive concept. Note that the flexible program operation is to program only a selected memory cell during a program operation while all memory cells are erased to background data.

The variable resistance memory device 1300 comprises a memory cell array 1310, an address decoder 1320, an address buffer 1330, a column selection circuit 1340, a write driver 1350, a data input/output (I/O) buffer 1360, a control logic 1370, and a storage 1380.

The memory cell array 1310 includes a plurality of memory cells. As exemplarily shown in FIG. 32, all memory cells in the memory cell array 1310 are erased to data "1" and data "0" is programmed to one memory cell 133. To the contrary, all the cells are erased to data "0" and data "1" is programmed to the memory cell 1311.

The address decoder 1320 is connected to the memory cell array 1310 through wordlines WL0~WLn, and the address buffer 1330 receives an address ADDR for a program operation. A column selection circuit 1340 is connected to the memory cell array 1310 through bitlines BL0~BLm. The column selection circuit 1340 electrically connects a bitline BLm to a data line DL in response to a select signal Yi.

The write driver 1350 receives pulse control signals BIA, P_RST, and P_SET and programs data "0" or "1" to a memory cell. In FIG. 32, the write driver 1350 programs the data "0" to one memory cell 1311 in response to a pulse control signal during a program operation.

A conventional variable resistance memory device programs data "0" or "1" to a selected memory cell during a program operation. In the meantime, according to the present inventive concept, a flexible program operation is performed to erase all memory cells to background data before being programmed and program only a corresponding memory cell. Thus, a write speed is considerably improved and power consumption is reduced during a program operation. The configuration and operation of the write driver 1350 will be described in some additional detail hereafter with reference to FIG. 35.

The control logic 1370 the generates pulse control signals BIA, P_RST, and P_SET in response to a program signal PGM during a program operation. The write driver 1350 programs data "0" or "1" to only a selected memory cell in response to a pulse control signal.

The storage 1380 stores background information (BG) 1381 during an erase operation. During a program operation, the storage 1380 reads the BG 1381 and generates the program signal PGM. The storage 1380 receives an address ADDR, data DQ, and a control signal CTRL and generates the program signal PGM. A flexible program operation of the variable resistance memory device 1300 will now be described with reference to FIG. 33.

Figure 33:
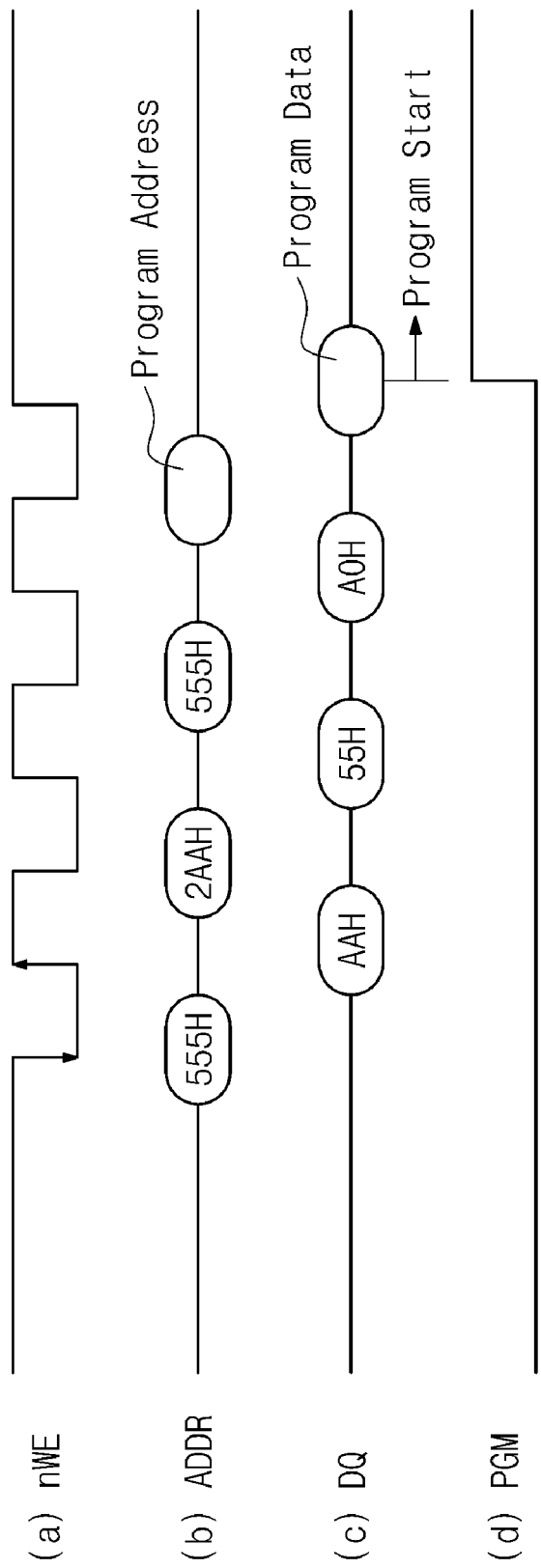
FIG. 33 is a timing diagram further illustrating the flexible program operation for the variable resistance memory device shown in FIG. 32.

FIG. 33 is a timing diagram further illustrating the flexible program operation of the variable resistance memory device 1300 shown in FIG. 32. Referring to FIG. 33, the variable resistance memory device 1300 needs a write enable signal nWE of four cycles for performing a flexible program operation. A program setup command A0H is applied when two cycles pass. A program address and program data are applied for the last cycle. A program signal PGM is generated in response to the program data.

The variable resistance memory device 1300 reads background information (BG) 1381 in the storage 1380. The program signal PGM is provided to a control logic 1370. In response to the program signal PGM, the control logic 1370 performs a flexible program operation. The variable resistance memory device 1300 programs only a selected memory cell according to the flexible program operation.

Figure 34:
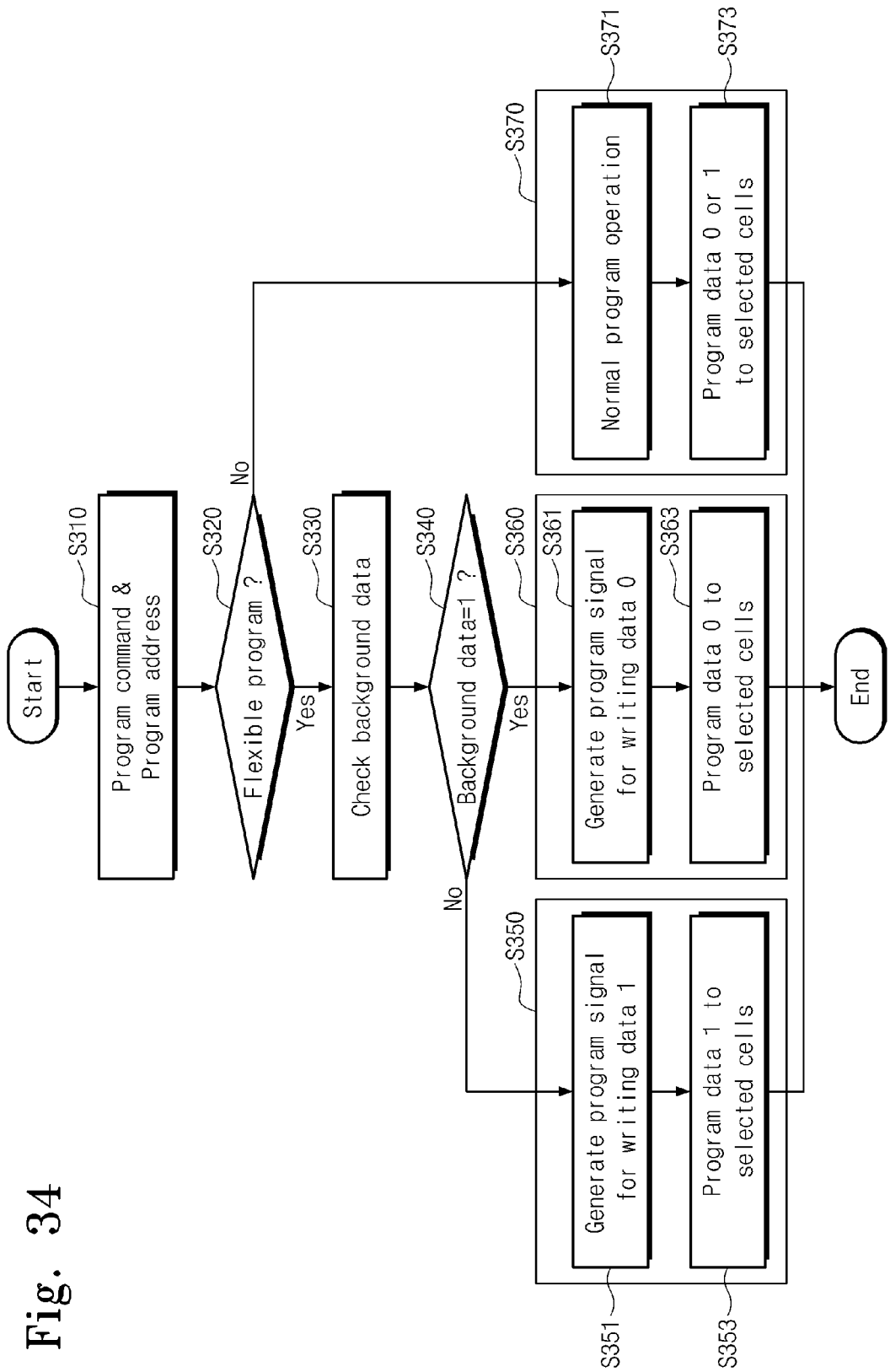
FIG. 34 is a flowchart summarizing the flexible program operation for the variable resistance memory device shown in FIG. 32.

FIG. 34 is a flowchart summarizing the flexible program operation of the variable resistance memory device 1300 shown in FIG. 32. The variable resistance memory device 1300 enables a write speed to be improved through a flexible program operation.

At S310, a program address and a program command are applied to the variable resistance memory device 1300. At S320, it is determined whether a program operation is a flexible program operation. The storage 1380 determines whether a program operation is a normal program operation or a flexible program operation, by using the program command.

If the program operation is not a flexile program operation, a normal program operation is performed (S370). That is, the normal program operation is performed (S371) and data "0" or "1" is programmed to a selected memory cell in a well-known manner. If the program operation is a flexible program operation, the flow proceeds to S330. At S330, background data 1381 stored in the storage 1380 is checked. At S340, it is determined whether the background data 1381 is data "1".

If the background data 1381 is data "0", an operation is performed to program data "1". At S351, the storage 1380 generates a program signal PGM for writing data "1". At S353, an operation is performed to program data "1" to a selected memory cell. The control logic 1370 generates pulse signals BIAS, P_RST, and P_SET in response to the program signal PGM. The write driver 1350 programs data "1" to the selected memory cell in response to a pulse control signal.

On the other hand, if the background data 1381 is data "1", an operation is performed to program data "0" (S360). At S361, the storage 1380 generates a program signal PGM for writing the data ")". At S363, an operation is performed to program data "0" to a selected memory cell. The control logic 1370 generates pulse control signals BIAS, P_RST, and P_SET in response to the program signal PGM. The write driver 1350 programs data "0" to the selected memory cell in response to a pulse control signal.

Figure 35:
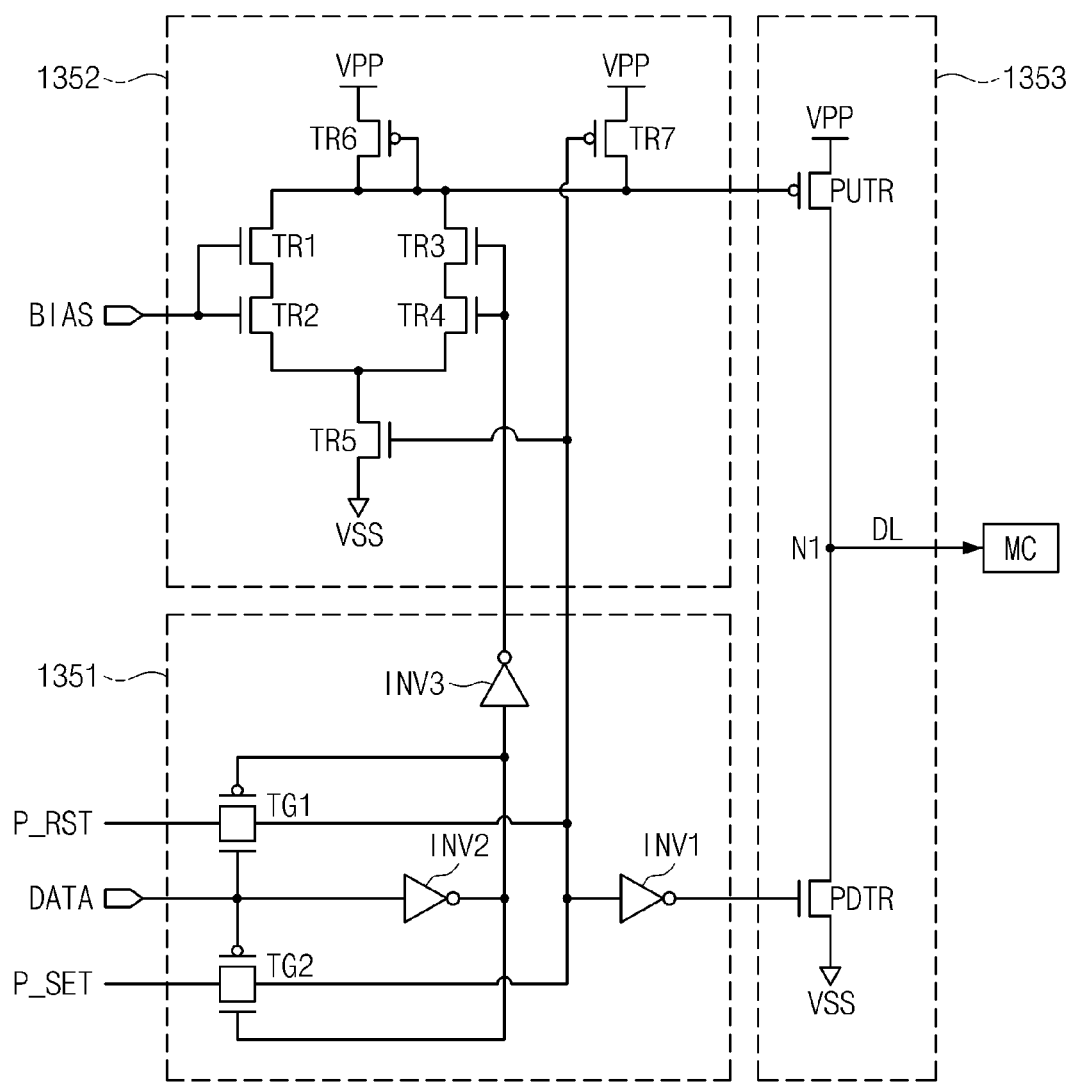
FIG. 35 is a circuit diagram of a write driver of the variable resistance memory device shown in FIG. 32.

FIG. 35 is a circuit diagram of the write driver 1350 adapted for use in the flexible program operation of the variable resistance memory device 1300 shown in FIG. 32. As illustrated, the write driver 1350 comprises a pulse control circuit 1351, a current control circuit 1352, and a current drive circuit 1353.

The pulse control circuit 1351 includes first and second transmission gates TG1 and TG2 and first to third inverters INV1~INV3. The current control circuit 1352 includes first to seventh transistors TR1~TR7. Specifically, the first to fifth transistors TR1~TR5 are NMOS transistors while sixth and seventh transistors are PMOS transistors. The current drive circuit 1353 includes a pull-up transistor PUTR and a pull-down transistor PDTR.

First, described is the case where input data DATA is "0". If the input data DATA is "0", the second transmission gate TG2 of the pulse control circuit 1351 is turned on while the third and fourth transistors TR3 and TR4 of the current control circuit 1352 are turned off. By a set pulse P_SET, the fifth transistor TR5 is turned on and the seventh transistor TR7 and the pull-down transistor PDTR are turned off. At this point, current flowing through the transistors TR1, TR2, TR5, and TR6 establishing a first current path flows the pull-up transistor PUTR due to current mirror effect. Current flowing through the pull-up transistor PUTR is supplied to a memory cell MC along a data line DL, as set current I_SET.

Next, described is the case where input data DATA is "1". If the input data DATA is "1", the first transmission gate TG1 of the pulse control circuit 1351 and the third and fourth transistors TR3 and TR4 of the current control circuit 1352 are turned on. By a reset pulse P_RST, the fifth transistor TR5 is turned on and the seventh transistor TR7 and the pull-down transistor PDTR are turned off. At this point, current flowing through the transistors TR1, TR2, TR5, and TR6 establishing a first current path and the transistors TR3, TR4, TR5, and TR6 establishing a second current path flows through the pull-up transistor PUTR due to current mirror effect. Current flowing through the pull-up transistor PUTR is supplied to a memory cell MC along a data line DL, as reset current I_RST.

Thus, the reset current I_RST has a greater current value than the set current I_SET. The reset pulse P_RST has a smaller pulse width than the set pulse P_SET. Accordingly, the reset current I_RST has a greater current value and a smaller pulse width than the set current I_SET. A selected memory cell is programmed to a reset state or a set state by the reset current I_RST or the set current I_SET.

FIG. 36 is a table listing certain operating characteristics for the variable resistance memory device 1300 shown in FIG. 32. If background data is "0", mode register setting (MRS) is set to a high level and fuse setting is set to a cutting state. All memory cells are erased to data "0" during an erase operation, and data "1" is programmed to a memory cell during a program operation.

If the background data is "1", mode register setting (MRS) is set to a low level and fuse setting is set to a not-cutting connection state. All memory cells are erased to background data "1" during an erase operation, and data "0" is programmed to a selected memory cell during a program operation. If the background data is "1", the variable resistance memory device 1300 are erased and programmed in the same manner as a flash memory.

Because the variable resistance memory device 1300 programs only a selected memory cell when the background data is "1", a write speed of the variable resistance memory device 1300 is much higher than that of a conventional variable resistance memory device. Moreover, a write speed when the background data is "0" is about five times higher than that when the background data "1".

Figure 37:
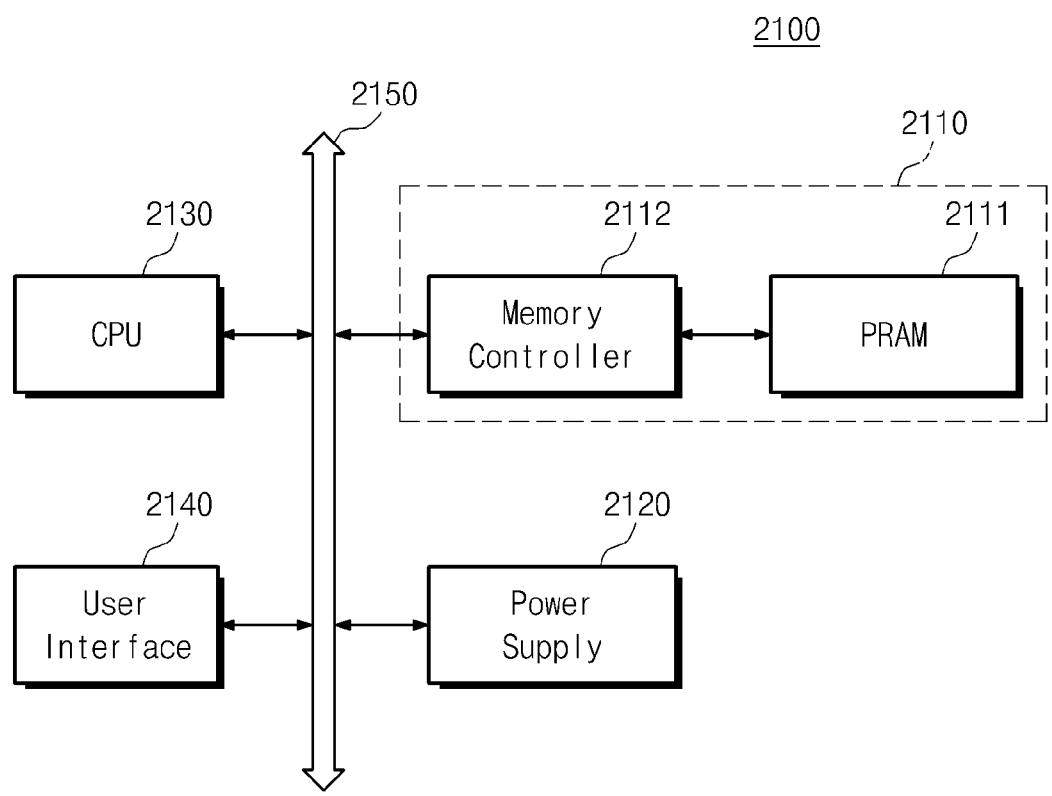
FIG. 37 is a block diagram generally illustrating a memory system including a variable resistance memory device according to an embodiment of the inventive concept.

FIG. 37 is a block diagram of a memory system 2100 incorporating a variable resistance memory device according to an embodiment of the inventive concept. As illustrated, the memory system 2100 comprises a semiconductor memory device 2110 comprising a variable resistance memory device 2111 and a memory controller 2112, a central processing unit (CPU) 2130 electrically connected to a system bus 2150, a user interface 2140, and a power supply 2120.

Data provided through the user interface 2140 or processed by the CPU 2130 is stored in the variable resistance memory device 2111 through the memory controller 2112. The semiconductor device 2110 may be comprised of comprise a solid-state disk (SSD). In this case, a write speed of the memory system 2100 may be dramatically improved.

Although not shown in the illustrated embodiment, one skilled in the art will recognize that the memory system may further include an application chipset, a camera image processor (CIS), a mobile DRAM, and the like.

Figure 38:
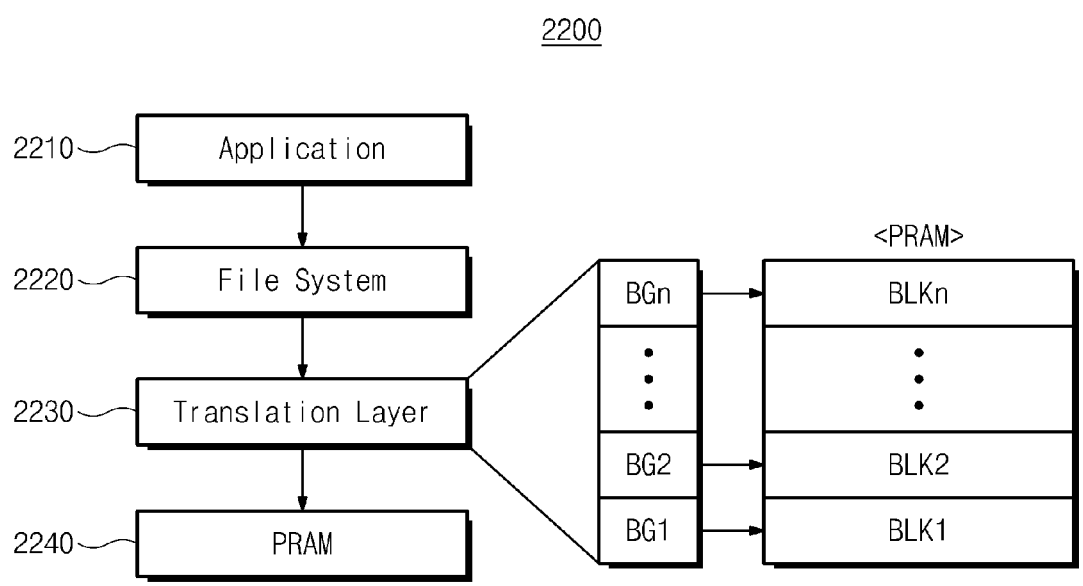
FIG. 38 illustrates a possible software configuration for the memory system of FIG. 37.

FIG. 38 conceptually illustrates one possible software configuration for a memory system incorporating a variable resistance memory device according to an embodiment of the inventive concept. Referring to FIG. 38, a hierarchical structure 2200 of the memory system includes an application 2210, a file system 2220, a translation layer 2230, and a variable resistance memory 2240.

The file system 2220 receiving a request such as read, write, and erase from the application 2210 transfers a sector address, which is a read, write or erase target, to the translation layer 2230. The translation layer 2230 transfers the sector address to the variable resistance memory device 2240 after translating the sector address to a physical address.

As illustrated in FIG. 38, the translation layer 2230 may manage background information of the variable resistance memory device 2240. That is, the translation layer 2230 manages background information BG1~BGn corresponding to memory blocks BLK1~BLKn of the variable resistance memory device 2240 and manages a chip or block erase operation which is discussed above.

A variable resistance memory device according to the inventive concept erases a memory cell to background data through a chip erase operation or a block erase operation and programs only specific data during a program operation. According to the inventive concept, because the variable resistance memory device is compatible with a flash memory, it may be applied to products using a flash memory such as a memory card and an SSD.

FIGS. 39 through 50 illustrate various application possibilities for embodiments of the inventive concept.

Figure 39:
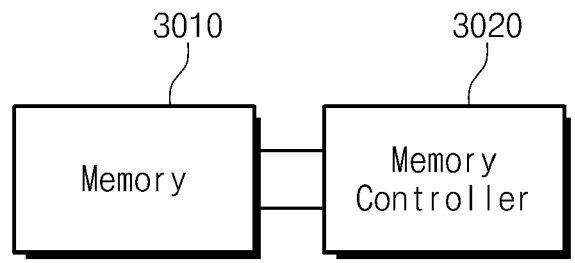
FIG. 39 is a block diagram illustrating one possible application for a semiconductor device according to an embodiment of the inventive concept.

For example, FIG. 39 illustrates one possible application embodiments for a semiconductor device according to an embodiments of the inventive concept and comprises a memory 3010 connected to a memory controller 3020. The memory 3010 may be any of the semiconductor device embodiments described above. The memory controller 3020 supplies the input signals for controlling operation of the memory 3010. For example, the memory controller 3020 supplies the command CMD and address signals. The memory controller 3020 may include a memory interface, a host interface, an error detection/correction (ECC) circuit, a central processing unit (CPU), and a buffer memory. The memory interface provides data transmitted from the buffer memory to the memory 3010 or transmits data read out of the memory 3010 to the buffer memory. Also the memory interface may provide a command or an address transmitted from an external host to the memory 3010.

The host interface may communicate with an external host through USB (Universal Serial Bus), SCSI (Small Computer System Interface), PCI express, ATA, PATA (Parallel ATA), SATA (Serial ATA), SAS (Serial Attached SCSI).

A memory system according to embodiments of the inventive concept may further include an ECC circuit, which generates a parity bit using data transmitted to a memory 3010. The generated parity bit may be stored in a specific area of the memory 3010, together with data. The ECC circuit detects an error of data read out of the memory 3010. If the detected error is within a correction range, the ECC circuit corrects the detected error.

The CPU processes a signal input from the external host after analyzing the input signal. The CPU controls the external host or the memory 3010 through the host interface or the memory interface. The CPU may control write, read, and erase operations depending on firmware for driving a memory.

The buffer memory temporarily stores write data provided from the external host or data read out of the memory 3010. Also the buffer memory may store meta data or cache data to stored in the memory 3010. During a sudden power-off operation, meta data or cache data stored in the buffer memory may be stored in the memory 3010. The buffer memory may include a DRAM and an SRAM.

Figure 40:
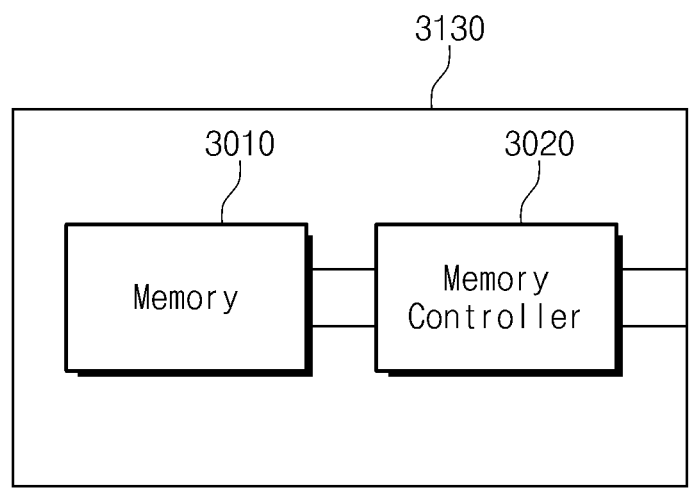
FIG. 40 is a block diagram illustrating another possible application for a semiconductor device according to an embodiment of the inventive concept.

FIG. 40 illustrates yet another application embodiment. This embodiment is the same as the embodiment of FIG. 39, except that the memory 3010 and memory controller 3020 have been embodied as a card 3130. For example, the card 3130 may be a memory card such as a flash memory card. Namely, the card 3130 may be a card meeting any industry standard for use with a consumer electronics device such as a digital camera, personal computer, etc. It will be appreciated that the memory controller 3020 may control the memory 3010 based on controls signals received by the card 3130 from another (e.g., external) device.

Figure 41:
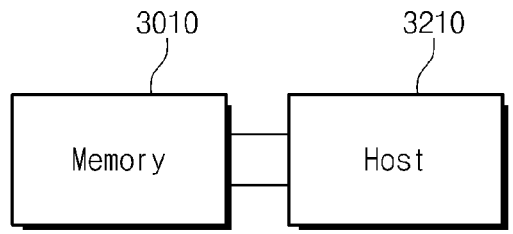
FIG. 41 is a block diagram illustrating yet another possible application for a semiconductor device according to an embodiment of the inventive concept.

FIG. 41 illustrates a still further embodiment of the present inventive concept. As shown, the memory 3010 may be connected with a host system 3210. The host system 3210 may be a processing system such as a personal computer, digital camera, etc. The host system 3210 may use the memory 3010 as a removable storage medium. As will be appreciated, the host system 3210 supplies the input signals for controlling operation of the memory 3010. For example, the host system 3210 may supply the command CMD and address signals.

Figure 42:
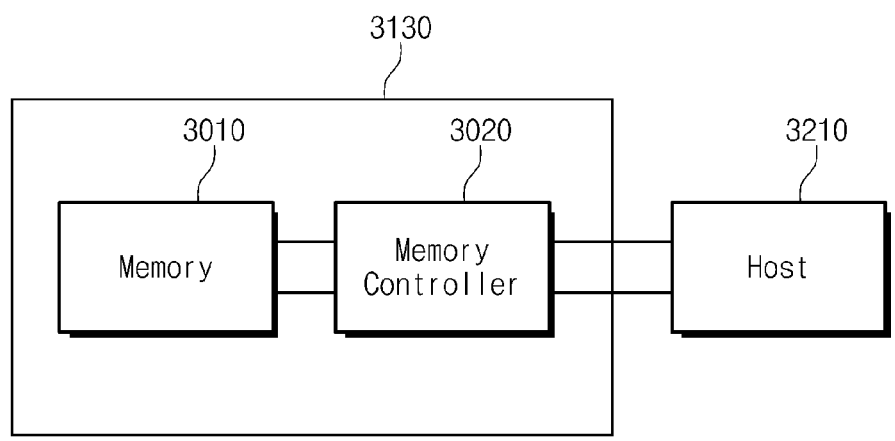
FIG. 42 is a block diagram illustrating another possible application for a semiconductor device according to still another embodiment of the inventive concept.

FIG. 42 illustrates yet another application embodiment of the present inventive concept in which the host system 3210 is connected to the card 3130 of FIG. 40. In this embodiment, the host system 3210 applies control signals to the card 3130 such that the memory controller 3020 controls operation of the memory 3010.

Figure 43:
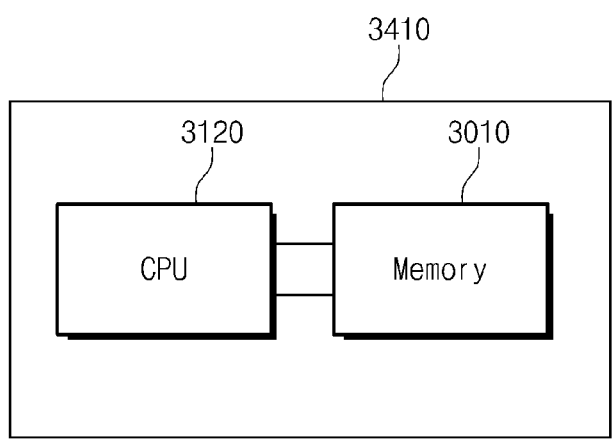
FIG. 43 is a block diagram illustrating another possible application for a semiconductor device according to still another embodiment of the inventive concept.

FIG. 43 illustrates yet another application embodiment of the inventive concept. As shown, the memory 3010 may be connected to a central processing unit (CPU) 3420 within a computer system 3410. For example, the computer system 3410 may be a personal computer, personal data assistant, etc. The memory 3010 may be directly connected with the CPU 3420, connected via a bus, etc. It will be appreciated, that FIG. 42 does not illustrate the full complement of components that may be included within a computer system 3410 for the sake of clarity.

Figure 44:
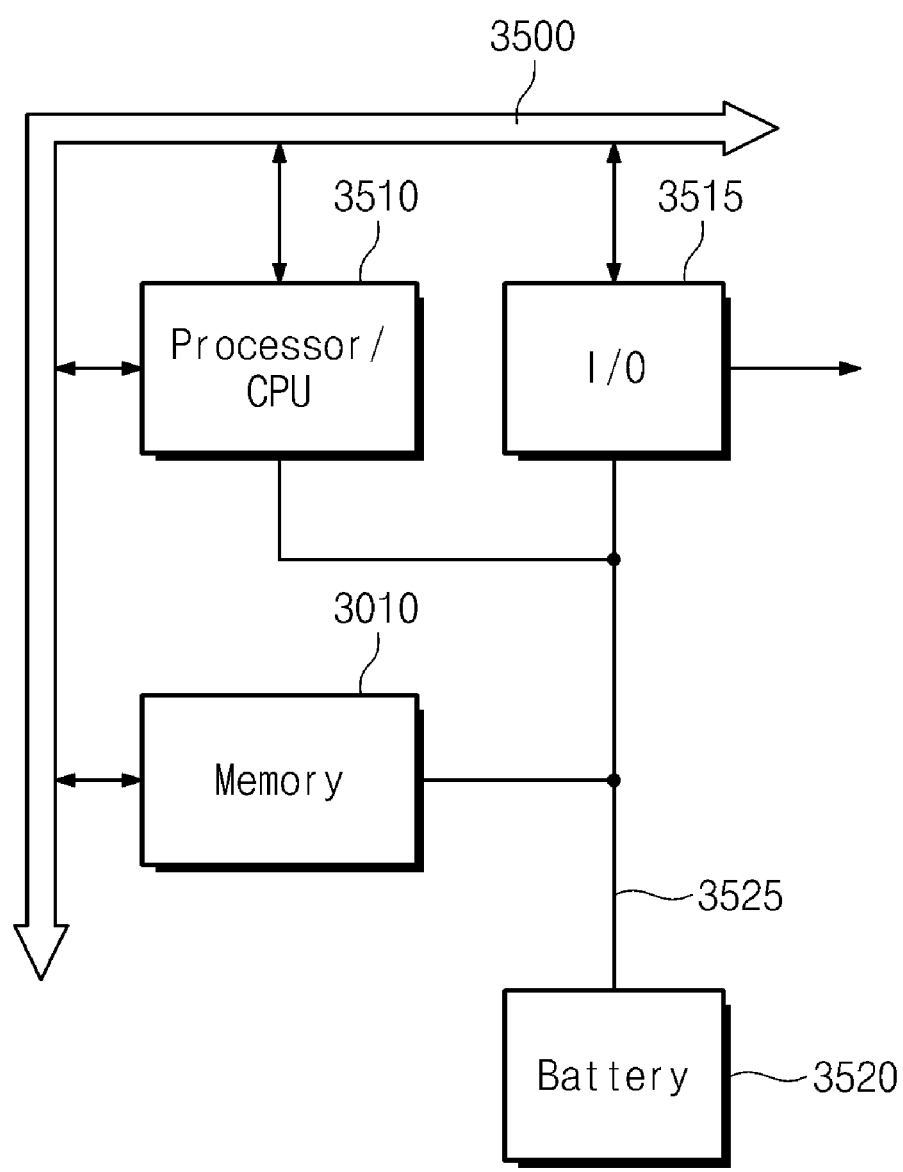
FIG. 44 is a block diagram illustrating another possible application for a semiconductor device according to still another embodiment of the inventive concept.

FIG. 44 illustrates yet another application embodiment of the inventive concept. FIG. 44 may represent another portable application of the semiconductor device embodiments described above. As shown, this embodiment includes the memory 3010, which may be any of the semiconductor device embodiments described above. In this and any of the previous embodiments, the memory 3010 may include one or more integrated circuit dies where each die has a memory array that operates according to the various embodiments. These IC dies may be separate, stand alone memory devices that are arranged in modules such as conventional dynamic random access memory (DRAM) modules, or they may be integrated with other on-chip functionalities. In the latter embodiments, the memory 3010 may be part of an I/O processor or a microcontroller as described above.

This and the other portable application embodiments may be for instance a portable notebook computer, a digital still and/or video camera, a personal digital assistant, a mobile (cellular) hand-held telephone unit, navigation device, GPS system, audio and/or video player, etc. Of course, there are other non-portable applications for the memory 3010. These include, for instance, large network servers or other computing devices which may benefit from a non-volatile memory device.

The application embodiment illustrated in FIG. 44 includes a processor/CPU 3510 that uses the memory 3010 as program memory to store code and data for its execution. Alternatively, the memory 3010 may be used as a mass storage device for non-volatile storage of code and data. The portable application embodiment may communicate with other devices, such as a personal computer or a network of computers via an I/O interface 3515. This I/O interface 3515 may provide access to a computer peripheral bus, a high speed digital communication transmission line, or an antenna for unguided transmissions. Data communication between the processor/CPU 3510 and memory 3010, as well as between the processor/CPU 3510 and the I/O interface 3515 may be accomplished using conventional computer bus architectures as represented by bus 3500.

The foregoing is but one illustrative example and the inventive concept is not limited to only this particular architecture. For example, the memory 3010 may be replaced with the embodiment of FIG. 40, and communication with the processor 3510 may be via the memory controller 3020. Furthermore, the I/O interface 3515 may communicate with the memory 3010 via the memory controller 3020, or directly with the memory 3010 if the memory controller 3020 is not present. In portable applications, the above-described components are powered by a battery 3520 via a power supply bus 3525.

Figure 45:
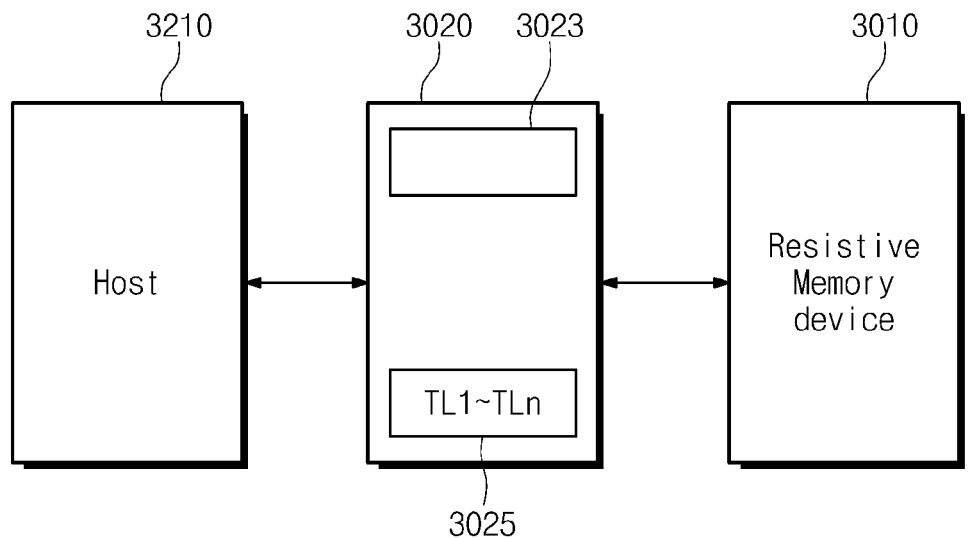
FIG. 45 is a block diagram of a memory system according to an embodiment of the present inventive concept.

FIG. 45 is a block diagram illustrating yet another application embodiment, a memory system 3700, according to the inventive concept. As shown, the memory system 3700 comprises a resistive memory device 3010, a controller 3020, and a host 3210. The resistive memory device 3010 may be configured to store single-bit data or multi-bit data in a single memory cell. A memory cell in which single-bit data is stored is called "a single-bit cell", while a memory cell in which multi-bit data is stored is called "a multi-bit cell". An operating method of the controller 3020 will now be described hereinafter with respect to an example in the case where multi-bit data is stored.

The controller 3020 is configured to control the resistive memory device 3010 when an access is requested from the host 3210. That is, the controller 3020 first maps a logical address of input data (program data) to a first physical address of a first bit (LSB) of multi-bit cells in the resistive memory device 3010 when an access is requested from the host 3210. If mapping the logical address of program data to the first physical address of a first bit (LSB) is completed, the controller 3020 sequentially maps a logical address of program data to a second physical address of a second bit (MSB) of multi-bit cells in the resistive memory device 3010. The mapped first and second physical addresses are provided to the resistive memory device 3010. The resistive memory device 3010 sequentially writes program data into second bits of multi-bit cells in the resistive memory device 3010 after first writing the program data into first bits of multi-bit cells in the resistive memory device 3010 in sequence of the mapped first and second physical addresses.

For this, the controller 3020 includes a control block 3023 and a memory 3025. One or more translation layers TL1~TLn are stored in the memory 3025. When an access is requested from the host 3210, the control block 3023 maps a logical address of program data to a physical address of a multi-bit memory cell by using the translation layers TL1~TLn.

Also the controller 3020 may determine whether an access request from the host 3210 is associated with an area of the resistive memory device 3010, by using the translation layers TL1~TLn. The controller 3020 may select one of the translation layers TL1~TLn according to a result of the determination and manage mapping information of the resistive memory device 3010 according to a selected translation layer.

In order to write a small amount of data, the control block 3023 selects a proper translation layer (e.g., a translation layer depending on page mapping) to perform a write operation by a unit of page. According to the selected translation layer, a logical address of program data is first mapped to first physical addresses by a unit of page before being mapped to second physical addresses. Consequently, the resistive physical device 3010 performs a write operation by a unit of page.

In order to write a large amount of data, the control block 3023 selects a proper translation layer (e.g., a translation layer depending on block mapping) to perform a write operation by a unit of block. According to the selected translation layer, a logical address of program data is first mapped to first physical addresses by a unit of block before being mapped to second physical addresses. Consequently, the resistive memory device 3010 perform a write operation by a unit of block. Undoubtedly, this approach may be applied to the whole area of the memory cell array in the resistive memory device 3010 without performing a write operation by a unit of page or block.

A semiconductor device according to certain embodiments of the inventive concept may be used as a storage class memory (SCM), which is the general concept of memories capable of simultaneously providing nonvolatile characteristics and access characteristics. The storage class memory may be utilized as not only a data storage space but also a program performing space.

The above-described PRAM, FeRAM, and MRAM are selected examples of a broad class of data storage devices. Such data storage devices may be used not only as general data storage units but as replacements for conventional flash memory main memory applications such as SRAM, etc.

Figure 46:
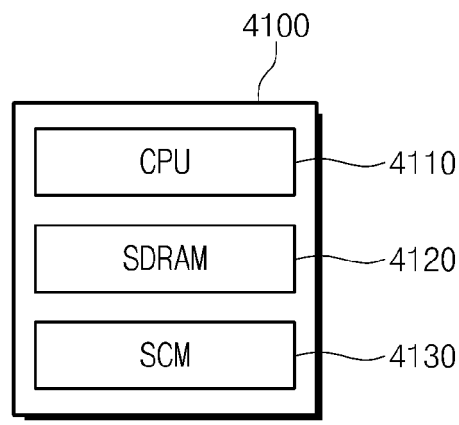
FIG. 46 is a bock diagram of a memory system according to yet another embodiment of the present inventive concept.

FIG. 46 illustrates yet another application embodiment of the inventive concept and includes a memory system 4100 in which a storage class memory (SCM) is used instead of flash memory. As illustrated, the memory system 4100 comprises a CPU 4110, an SDRAM 4120, and an SCM 4130 used instead of a flash memory.

In the memory system 4100, data access speed of the SCM 4130 is higher than that of a flash memory. For example, under a PC environment where the CPU 4110 runs at 4 GHz, data access speed of a PRAM which is a kind of the SCM 4130 is about 32 times higher than that of a flash memory. Thus, the memory system 4100 equipped with the SCM 4130 may attain higher-speed access gain than a memory system equipped with a flash memory.

Figure 47:
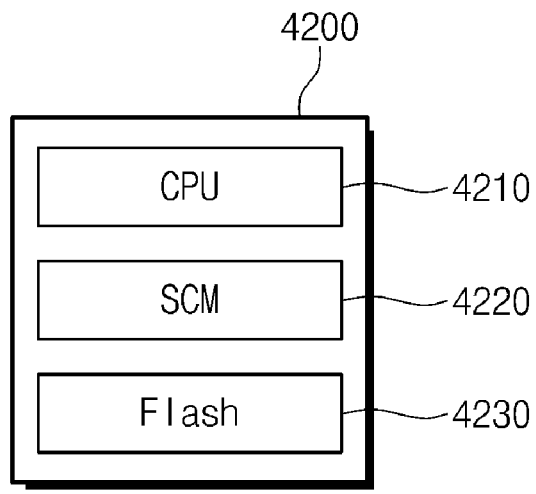
FIG. 47 is a bock diagram of a memory system according to yet another embodiment of the present inventive concept.

FIG. 47 illustrates still another application embodiment for the inventive concept and includes a memory system 4200 in which an SCM is used instead of an SDRAM. As illustrated, the memory system 4200 comprises a CPU 4210, an SCM 4220, and a flash memory 4230. The SCM 4130 is used as a main memory instead of an SDRAM.

In the memory system 4200, power dissipation of the SCM 4220 is lower than that of an SDRAM. Energy dissipation for a main memory in a computer system can account for up to 40 percent of total energy use. Therefore, significant efforts have been made to reduce the required amount of energy dissipation from main memories. Incorporation of a SCM may reduce energy dissipation requirements on average about 53 percent, and reduce energy dissipation caused by power leakage on average about 73 percent. As a result, the memory system 4200 equipped with the SCM 4220 allows power dissipation to be reduced more than a memory system equipped with an SDRAM.

Figure 48:
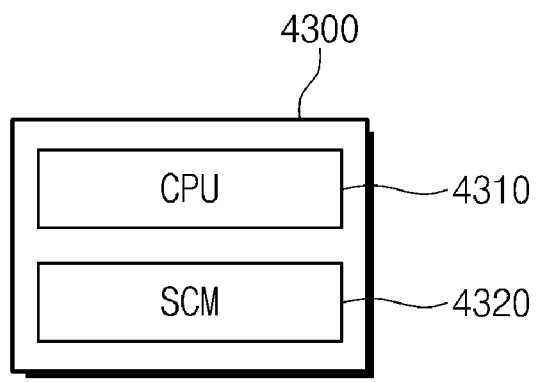
FIG. 48 is a bock diagram of a memory system according to still another embodiment of the present inventive concept.

FIG. 48 illustrates still another application embodiment for the inventive concept and include a memory system 4300 in which an SCM replaces an SDRAM as well as flash memory. As illustrated, the memory system 4300 comprises a CPU 4310 and an SCM 4320. The SCM 4320 is used as a main memory instated of an SDRAM and as a data storage memory instead of a flash memory. This memory system 4300 is advantageous in data access speed, low power, space utilization, and costs.

Figure 49:
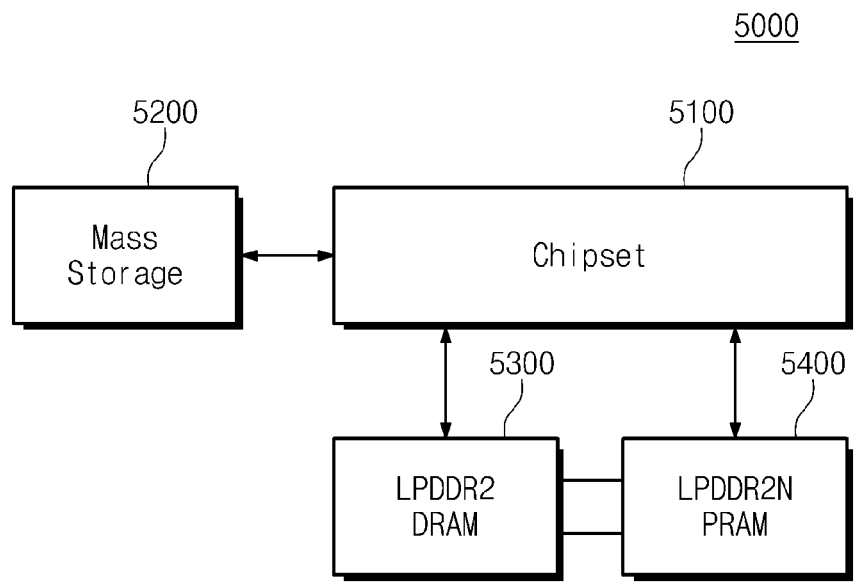
FIG. 49 is a bock diagram of a memory system according to still another embodiment of the present inventive concept.

FIG. 49 is a block diagram of a mobile system 5000 including a variable resistance memory device according to an embodiment of the inventive concept. As illustrated, the memory system 5000 comprises a chipset 5100, a mass storage 5200, an LPDDR2-DRAM 5300, and an LPDDR2N-PRAM 5400. The mass storage 5200 is a high-capacity storage such as a hard disk drive (HDD) or a flash memory. The LPDDR2-DRAM 5300 is a low-power DDR2 DRAM, and the LPDDR2N-PRAM 5400 is a low-power DDR2nonvolatile PRAM acting as a variable resistance memory device.

In mobile systems such as the illustrated mobile system 5000, the use of a DRAM is increasing. However, DRAM consumes a large amount of standby current because it performs a refresh operation even in a standby state. Increase of the standby current causes power of a battery (not shown) to be consumed and causes time of practically using the mobile system 5000 to be reduced. A variable resistance memory device (e.g., PRAM) according to an embodiment of the inventive concept need not perform a refresh operation. Therefore, if the variable resistance memory device is used instead of a DRAM or together with a DRAM, the mobile system 5000 may reduce power consumption.

Figure 50:
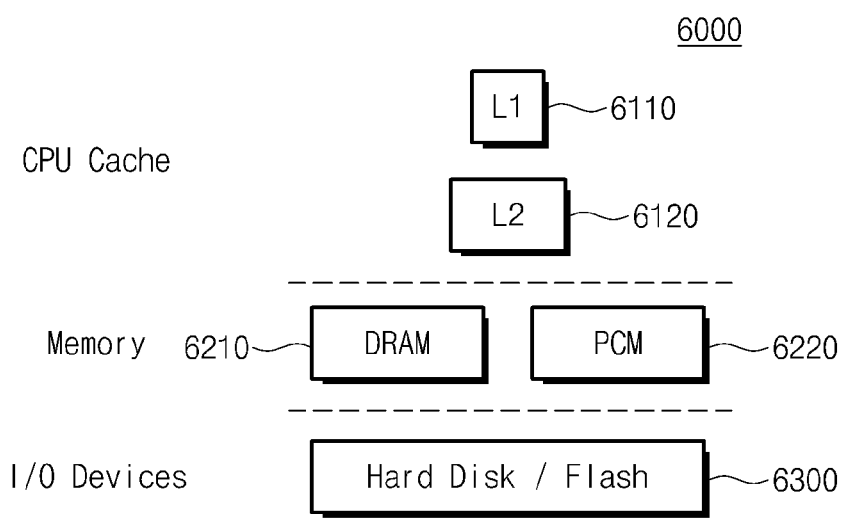
FIG. 50 is a bock diagram of a memory system according to still another embodiment of the present inventive concept.

FIG. 50 is a concept diagram illustrating a hierarchical structure of a computer system 6000 including a variable resistance memory device according to an embodiment of the inventive concept. As illustrated, the computer system 6000 comprises a CPU cache memory in an upper layer, a DRAM and a phage change memory (PCM) in a middle layer, and a hard disk or a flash memory in a lower layer. According to the hierarchical structure illustrated in FIG. 50, data access speed is highest in the upper layer and lowest in the lower layer. A variable resistance memory device (e.g., PCM) according to an embodiment of the inventive concept may be substituted for a DRAM or used as a memory in the middle layer together with a DRAM, inside the computer system 6000.

The CPU cache memory in the upper layer may include a level 1 (L1) memory and a level 2 (L2) memory. The L1 memory and the L2 memory are included in a cache memory layer inside the computer system 5000. In a memory region in the middle layer, a DRAM 6210 and a PCM 6200 may be used together. For example, a 256-megabyte DRAM 6210 and a 1-gigbyte PCM 6220 may be installed a computer system after being merged into a module. In this case, the DRAM 6210 for processing data of a CPU at high speed and the PCM 6220 for storing the data may act as a main memory. Similar to an external peripheral device, a lower layer of a hard disk drive (HDD) or a flash memory device 6300 may store data through a predetermined interface such as ATA/SATA or communicate with a main memory or the CPU.

A variable resistance memory device according to an embodiment of the inventive concept may be applied to a server-oriented SSD. For example, published U.S. Patent Applications. 2008/0256292; 2008/0256183; and 2008/0168304 variously disclose a solid-state storage including a PRAM, a flash memory, an MRAM, an NRAM, and DRAM, as well as a solid-state storage device includes a solid-state storage controller and a solid-state storage. Published U.S. Patent Applications. 2008/0256292; 2008/0256183; and 2008/0168304 disclosed a solid-state memory and controller improving the speed of a high-speed interface as well as a redundant array of independent drivers (RAID) in a solid-sate device. The collective subject matter of these published U.S. Patent Applications is hereby incorporated by reference.

Although the present inventive concept has been described in connection with certain embodiments illustrated in the accompanying drawings, it is not limited thereto. Persons skilled in the art will recognize that embodiments of the inventive concept may be applied to other types of memory devices. The above-disclosed subject matter is to be considered illustrative, and not restrictive, and the appended claims are intended to cover all such modifications, enhancements, and other embodiments, which fall within the scope of the present inventive concept. Thus, to the maximum extent allowed by law, the scope of the inventive concept is to be determined by the broadest permissible interpretation of the following claims and their equivalents, and shall not be restricted or limited to only the foregoing detailed description.

What is claimed is:

1. A variable resistance memory device comprising:
a memory cell array including a plurality of variable resistance memory cells divided into a first area and a second area;
an input/output circuit configured to access the memory cell array; and
a control logic configured to control the input/output circuit to access the first area or the second area in response to an external command,
wherein the input/output circuit supplies read current to at least one memory cell during a read operation,
wherein the first area has higher response speed and shorter data access time than the second area,
wherein the control logic is further configured to erase the second area as a first logic state and program selected memory cells of the second area as a second logic state,
wherein the variable resistance memory device further comprises a memory interface configured to control the control logic in response to externally applied control signals and a select signal selecting between the first area and the second area, and
wherein the control signals include a command, an address, and data.

2. The variable resistance memory device of claim 1, wherein the memory cell array is divided into a plurality of memory banks, each capable of independently performing the read operation and a write operation.

3. The variable resistance memory device of claim 1, wherein the memory interface is further configured to convert the control signals into first area access signals or second area access signals in response to the select signal.

4. The variable resistance memory device of claim 1, wherein the memory interface is further configured to control the control logic so that code data or meta data is stored in the first area.

5. The variable resistance memory device of claim 4, wherein the first area comprises a plurality of banks, and the code data and meta data are stored in separate banks.

6. The variable resistance memory device of claim 5, wherein the memory interface is further configured to enable one of the code data and the meta data to be written while the other is being read.

7. A memory system comprising:
a variable resistance memory device including a variable resistance memory cell array divided into a first area and a second area;
a memory controller configured to access the first area or the second area in response to an external command, wherein the memory controller erases the second area as a first logic state, and programs selected memory cells of the second area as a second logic state; and
a memory interface configured to access the first area or the second area of the variable resistance memory cell array in response to the control signals and a select signal selecting between the first area and second area
wherein the control signals and select signal are received from the memory controller, and the control signals include a command, an address, and data.

8. The memory system of claim 7, wherein the memory interface is further configured to convert the control signals into first area access signals or second area access signals in response to the select signal.

9. The memory system of claim 7, wherein the memory controller is further configured to control the memory interface so that at least one of code data and meta data is stored in the first area of the variable resistance memory device.

10. The memory system of claim 7, wherein the memory controller is further configured to control the memory interface such that user data is stored in the second area.

11. The memory system of claim 7, wherein the variable resistance memory cell array includes a plurality of phase change memory cells.

12. The memory system of claim 7, wherein the memory controller is further configured to store area information of the first area and the second area and detect a storage location for data with reference to the area information.

13. The memory system of claim 12, wherein the area information is varied by a mode register setting (MRS) or a fuse setting.

* * * * *